(12) United States Patent
Kamino et al.

(10) Patent No.: US 11,222,924 B2
(45) Date of Patent: *Jan. 11, 2022

(54) PHOTOVOLTAIC DEVICE

(71) Applicant: OXFORD PHOTOVOLTAICS LIMITED, Oxfordshire (GB)

(72) Inventors: Brett Akira Kamino, Neuchâtel (CH); Laura Miranda Perez, Oxfordshire (GB)

(73) Assignee: OXFORD PHOTOVOLTAICS LIMITED, Oxfordshire (GB)

( * ) Notice: Subject to any disclaimer, the term of this patent is extended or adjusted under 35 U.S.C. 154(b) by 34 days.

This patent is subject to a terminal disclaimer.

(21) Appl. No.: 16/811,569

(22) Filed: Mar. 6, 2020

(65) Prior Publication Data

US 2020/0279890 A1 Sep. 3, 2020

Related U.S. Application Data

(63) Continuation of application No. 15/735,330, filed as application No. PCT/GB2016/051728 on Jun. 10, 2016, now Pat. No. 10,622,409.

(30) Foreign Application Priority Data

| Jun. 12, 2015 | (GB) | ................................ 1510349 |
| Jun. 12, 2015 | (GB) | ................................ 1510355 |

(51) Int. Cl.
*H01L 27/30* (2006.01)
*H01L 51/00* (2006.01)
(Continued)

(52) U.S. Cl.
CPC .......... *H01L 27/302* (2013.01); *H01L 31/036* (2013.01); *H01L 31/0687* (2013.01);
(Continued)

(58) Field of Classification Search
CPC ................ H01L 31/075; H01L 31/036; H01L 31/0687; H01L 27/302; H01L 51/4226;
(Continued)

(56) References Cited

U.S. PATENT DOCUMENTS

2015/0122316 A1* 5/2015 Kenney ............... H01L 31/0725
136/255
2015/0129034 A1 5/2015 Snaith et al.

FOREIGN PATENT DOCUMENTS

| CN | 103762344 A | 4/2014 |
| CN | 105390614 A | 3/2016 |

(Continued)

OTHER PUBLICATIONS

First Office Action in connection to Indian Patent Application No. IN201717046119, dated Oct. 28, 2020.
(Continued)

*Primary Examiner* — Andrew J Golden
(74) *Attorney, Agent, or Firm* — Meunier Carlin & Curfman LLC

(57) ABSTRACT

There is provided a photovoltaic device that comprises a photoactive region, the photoactive region comprising a perovskite material of general formula $A_{1-x}A'_xBX_{3-y}X'_y$, wherein A is a formamidinium cation $(HC(NH_2)_2^+)$, A' is a caesium cation $(Cs^+)$ B is at least one divalent inorganic cation, X is iodide and X is bromide, and x is greater than 0 and equal to or less than 0.4 and y is greater than 0 and less than or equal to 3. There is also provided a method of producing a photovoltaic device comprising a photoactive region comprising the perovskite material, and formulations for use in the formation of the perovskite material.

15 Claims, 13 Drawing Sheets

(51) Int. Cl.

| | |
|---|---|
| *C09K 11/66* | (2006.01) |
| *H01L 51/44* | (2006.01) |
| *H01L 51/42* | (2006.01) |
| *H01L 31/036* | (2006.01) |
| *H01L 31/0687* | (2012.01) |
| *H01L 31/0725* | (2012.01) |
| *H01L 31/0256* | (2006.01) |

(52) U.S. Cl.
CPC ...... *H01L 31/0725* (2013.01); *H01L 51/0032* (2013.01); *H01L 51/424* (2013.01); *H01L 51/4226* (2013.01); *H01L 51/442* (2013.01); *H01L 51/447* (2013.01); *C01P 2002/34* (2013.01); *C09K 11/665* (2013.01); *H01L 2031/0344* (2013.01); *Y02E 10/549* (2013.01); *Y02P 70/50* (2015.11)

(58) Field of Classification Search
CPC .............. H01L 51/4213; H01L 51/442; H01L 51/424; H01L 51/447; H01L 51/0032; H01L 2031/0344; C09K 11/665; C09K 11/66; C09K 11/616
USPC ......................................................... 136/263
See application file for complete search history.

(56) References Cited

FOREIGN PATENT DOCUMENTS

| | | |
|---|---|---|
| GN | 105218594 A | 8/2018 |
| JP | 2015119102 A | 6/2015 |
| WO | 2013/171517 A1 | 11/2013 |
| WO | 2014/045021 A1 | 3/2014 |
| WO | 2015/017885 A1 | 2/2015 |
| WO | 2015084961 A1 | 6/2015 |

OTHER PUBLICATIONS

Kojima, A et al. "Organometal Halide Perovskites as Visible-Light Sensitizers for Photovoltaic Cells", J. Am. Chem. Soc. 2009,131(17), pp. 6050-6051.

Lee, M. et al. "Efficient Hybrid Solar Cells Based on Meso-Superstructured Organometal Halide Perovskites", Sciencexpress, 338(6107), pp. 643-647, Oct. 4, 2012.

Coutts, T. et al. "Modeled performance of polycrystalline thin-film tandem solar cells", Progress in Photovoltaics: Research and Applications, 10(3), pp. 195-203, May 2002.

Noh, J. et al. "Chemical Management for Colorful, Efficient, and Stable Inorganic-Organic Hybrid Nanostructured Solar Cells" Nano Letters, 2013.

Rouquerol, J. et al. "Recommendations for the characterization of porous solids", Pure and Applied Chemistry, 66(8), pp. 1739-1758, 1994.

Haber, J. "Manual on catalyst characterization", Pure and Applied Chemistry, 63(9), IUPAC documents, pp. 1227-1246, 1991.

Peumans, P. et al. "Small molecular weight organic thin-film photodetectors and solar cells", Appl. Phys. 93(7), pp. 3693-3723, Apr. 1, 2003.

Hirade, M. et al. "Small molecular organic photovoltaic cells with exciton blocking layer at anode interface for improved device performance", Appl. Phys. Lett. 99, 153302 (2011).

Docampo, P. et al. "Efficient organometal trihalide perovskite planar-heterojunction solar cells on flexible polymer substrates", Nat Comms, 4, 2013.

Etgar, L. et al. "Mesoscopic CH3NH3PbI3/TiO2 Heterojunction Solar Cells", J. Am. Chem. Soc., 2012, 134 (42), pp. 17396-17399.

Choi, H. et al. "Cesium-doped methylammonium lead iodide perovskite light absorber for hybrid solar cells", Nano Energy, 7, 80-85, May 6, 2014.

Eperon, G. et al. "Formamidinium lead trihalide: a broadly tunable perovskite for efficient planar heterojunction solar sells", Energy & Environmental Science, 7, 982-988, Jan. 6, 2015.

Yang, W.S. et al. "High-performance photovoltaic perovskite layers fabricated through intramolecular exchange", Science, vol. 348, No. 6240, Jun. 12, 2015.

International Search Report and Written Opinion dated Sep. 9, 2016, from International Application No. PCT/GB2016/051728, 13 pages.

Combined Search and Examination Report under Sections 17 and 18(3) dated Nov. 20, 2015, from United Kingdom Application No. GB1510349.2, 8 pages.

Combined Search and Examination Report under Sections 17 and 18(3) dated Nov. 20, 2015, from United Kingdom Application No. GB1510355.9, 7 pages.

Communication under Rule 71(3) EPC, Intention to Grant, issued in corresponding European Application No. 16729348.9, dated Nov. 6, 2018, 9 pgs.

Decision to Grant a European Patent Pursuant to Article 97(1) EPC, issued in corresponding European Application No. 16729348.9, dated Feb. 14, 2019, 2 pgs.

Extended Search Report issued by the European Patent Office dated May 15, 2019, in connection with corresponding European Application No. 19154192.9 (divisional of European Application No. 16729348.9), 7 pgs.

First Office Action, in connection to Chinese Patent Application No. CN202010836359.8, dated Mar. 23, 2021.

Second Office Action relating to Chinese Application No. 201680033408.6, dated May 22, 2020. (8 pages).

Office Action relating to Japanese Application No. 2017-564325, dated May 27, 2020. (5 pages).

Office Action relating to Japanese Application No. 2017-564325, dated Oct. 13, 2020.

\* cited by examiner

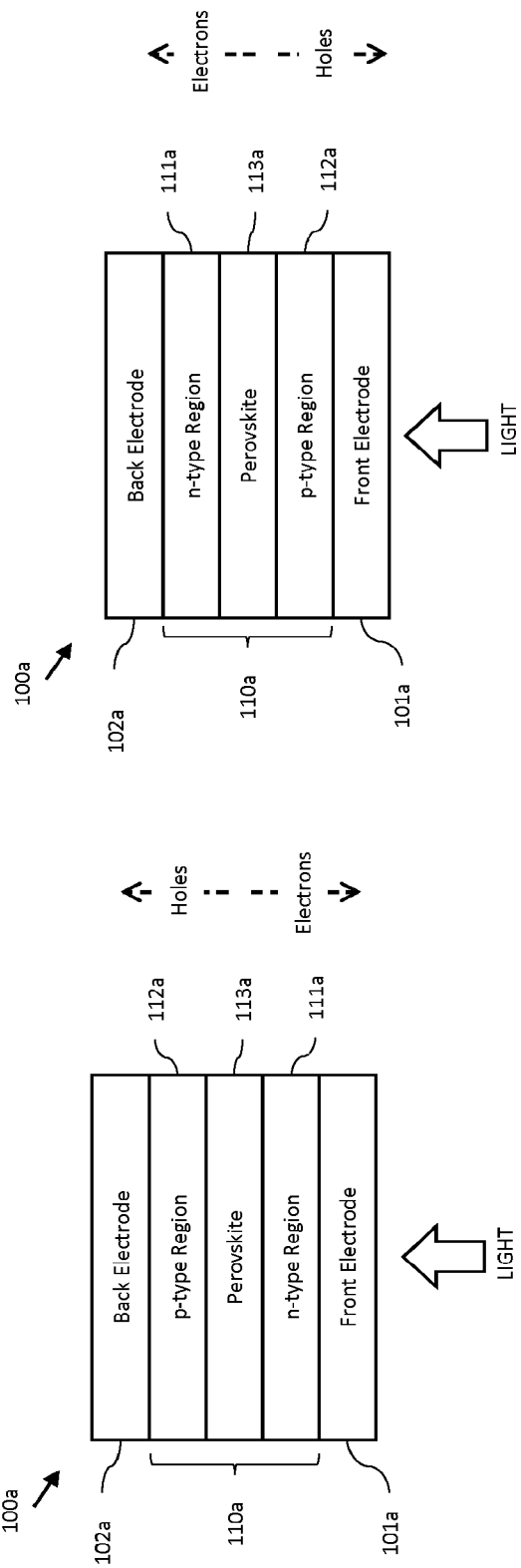

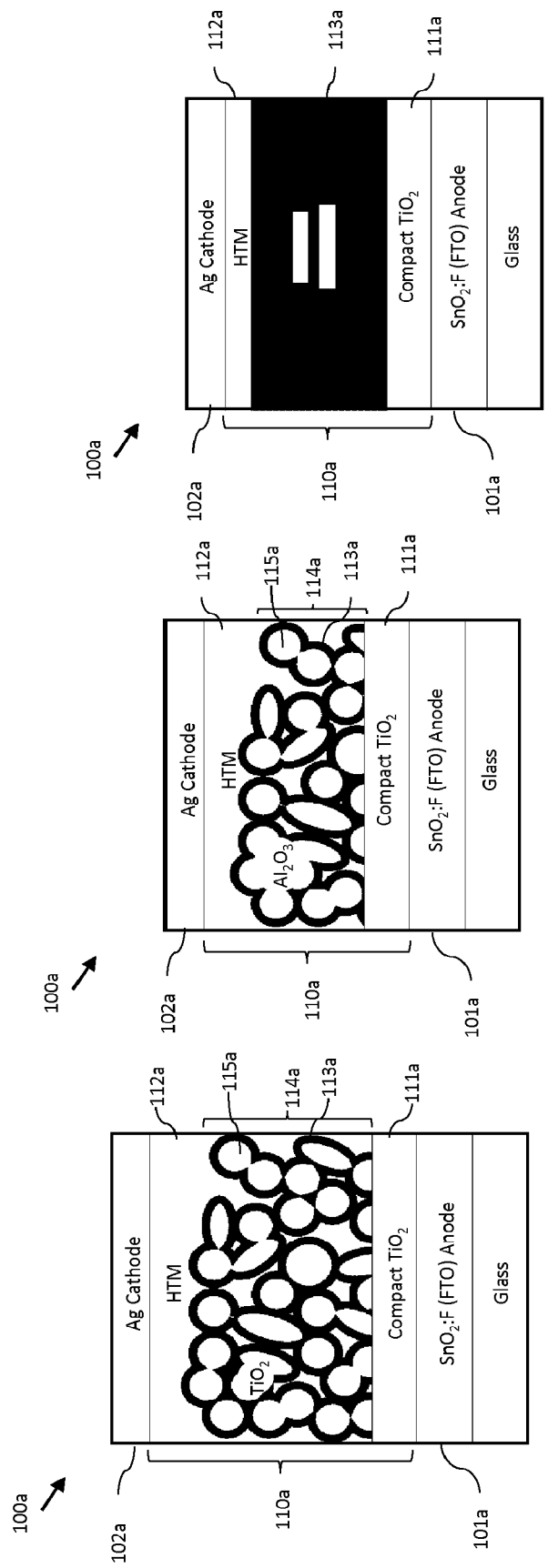

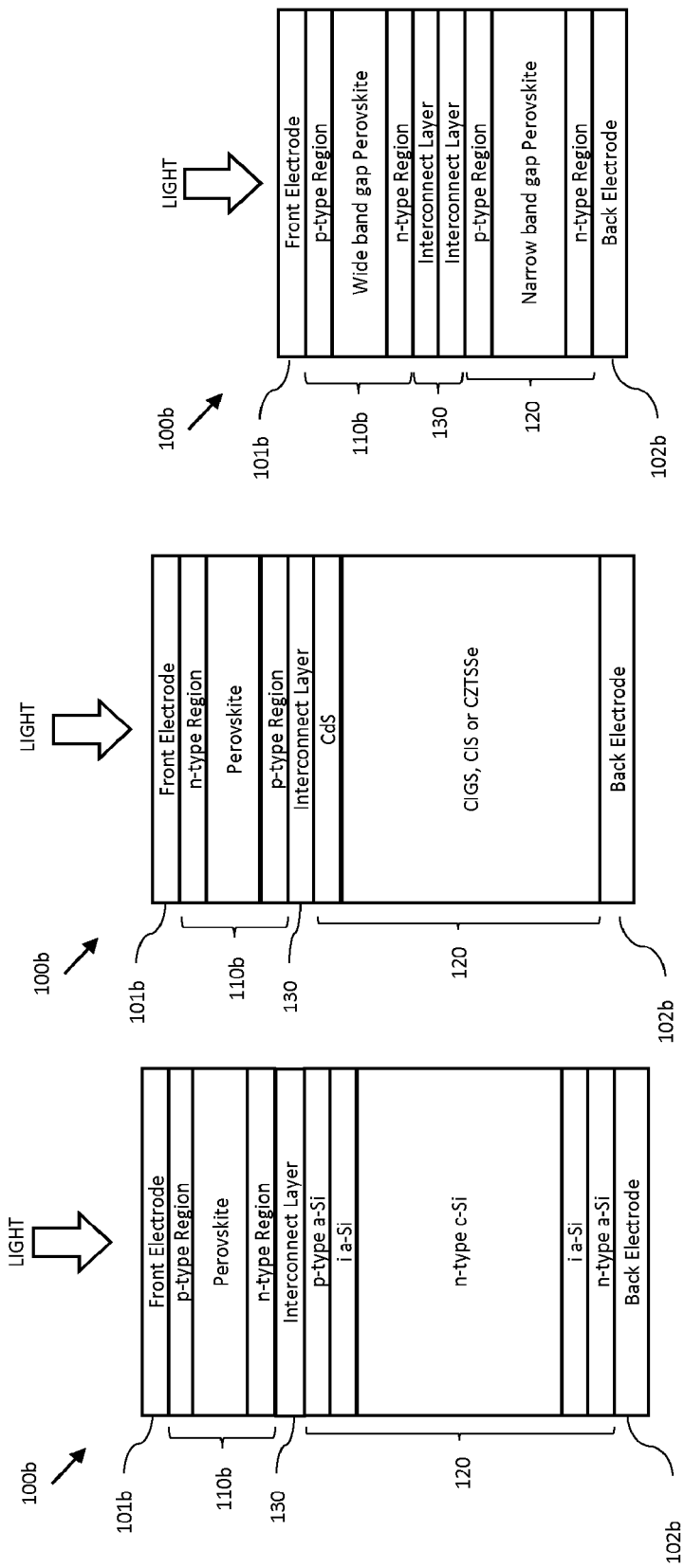

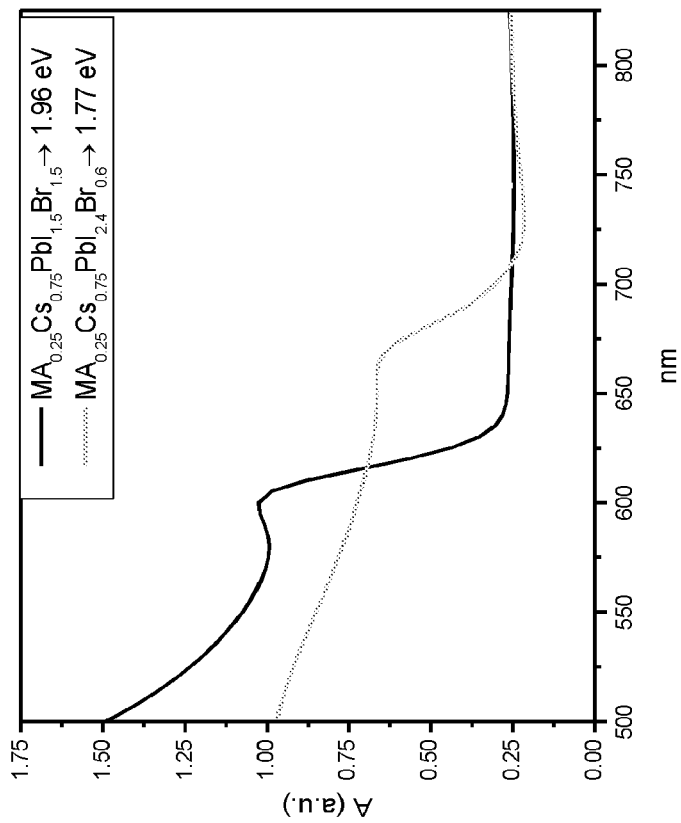
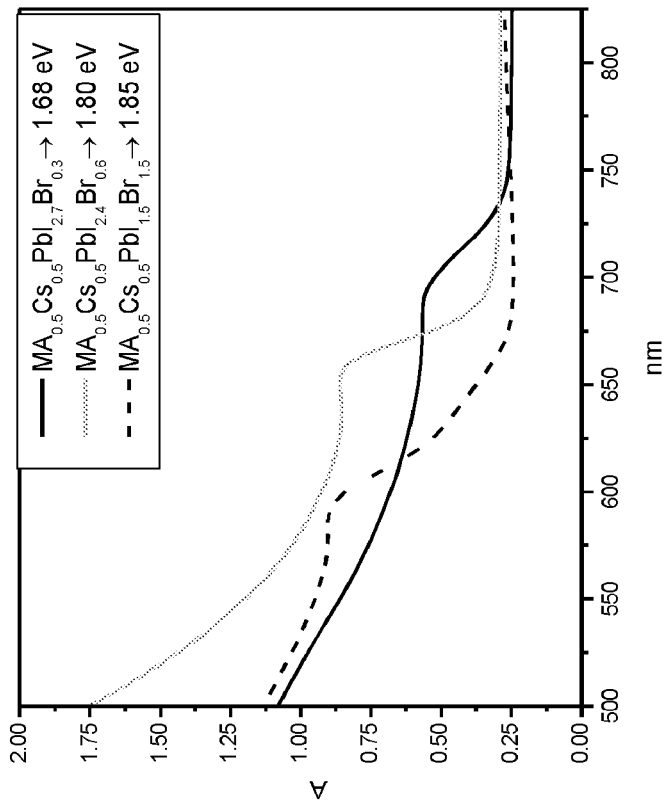
Figure 9b
Figure 9a

PHOTOVOLTAIC DEVICE

CROSS-REFERENCE TO RELATED APPLICATIONS

This application is a continuation of U.S. application Ser. No. 15/735,330, filed Dec. 11, 2017, which is a United States National Phase Application under 35 U.S.C. § 371 of International Application No. PCT/GB2016/051728, filed Jun. 10, 2016, and claims priority to Great Britain Patent Application 1510355.9, filed Jun. 12, 2015, and Great Britain Patent Application 1510349.2, filed Jun. 12, 2015, the disclosures of each of which are fully incorporated by reference in their entireties.

FIELD OF THE INVENTION

The present invention relates to a photovoltaic device that comprises a perovskite material that has both a bang gap that makes it suitable for use in multi-junction photovoltaic devices and improved stability, and methods and formulations for producing such a photovoltaic device.

BACKGROUND OF THE INVENTION

Over the past forty years or so there has been an increasing realisation of the need to replace fossil fuels with more secure sustainable energy sources. The new energy supply must also have low environmental impact, be highly efficient and be easy to use and cost effective to produce. To this end, solar energy is seen as one of the most promising technologies, nevertheless, the high cost of manufacturing devices that capture solar energy, including high material costs, has historically hindered its widespread use.

Every solid has its own characteristic energy-band structure which determines a wide range of electrical characteristics. Electrons are able to transition from one energy band to another, but each transition requires a specific minimum energy and the amount of energy required will be different for different materials. The electrons acquire the energy needed for the transition by absorbing either a phonon (heat) or a photon (light). The term "band gap" refers to the energy difference range in a solid where no electron states can exist, and generally means the energy difference (in electron volts) between the top of the valence band and the bottom of the conduction band. The efficiency of a material used in a photovoltaic device, such as a solar cell, under normal sunlight conditions is a function of the band gap for that material. If the band gap is too high, most daylight photons cannot be absorbed; if it is too low, then most photons have much more energy than necessary to excite electrons across the band gap, and the rest will be wasted. The Shockley-Queisser limit refers to the theoretical maximum amount of electrical energy that can be extracted per photon of incoming light and is about 1.34 eV. The focus of much of the recent work on photovoltaic devices has been the quest for materials which have a band gap as close as possible to this maximum.

One class of photovoltaic materials that has attracted significant interest has been the hybrid organic-inorganic halide perovskites. Materials of this type form an $ABX_3$ crystal structure which has been found to show a favourable band gap, a high absorption coefficient and long diffusion lengths, making such compounds ideal as an absorber in photovoltaic devices. Early examples of hybrid organic-inorganic metal halide perovskite materials are reported by Kojima, A et al. (2009) Organometal Halide Perovskites as Visible-Light Sensitizers for Photovoltaic Cells. J. Am. Chem. Soc., 131(17), pp. 6050-6051 in which such perovskites were used as the sensitizer in liquid electrolyte based photoelectrochemical cells. Kojima et al report that a highest obtained solar energy conversion efficiency (or power energy conversion efficiency, PCE) of 3.8%, although in this system the perovskite absorbers decayed rapidly and the cells dropped in performance after only 10 minutes.

Subsequently, Lee, M et al, (2012) Efficient Hybrid Solar Cells Based on Meso-Superstructured Organometal Halide Perovskites. Science, 338(6107), pp. 643-647 reported a "meso-superstructured solar cell" in which the liquid electrolyte was replaced with a solid-state hole conductor (or hole-transporting material, HTM), spiro-MeOTAD. Lee et al reported a significant increase in the conversion efficiency achieved, whilst also achieving greatly improved cell stability as a result of avoiding the use of a liquid solvent. In the examples described, $CH_3NH_3PbI_3$ perovskite nanoparticles assume the role of the sensitizer within the photovoltaic cell, injecting electrons into a mesoscopic $TiO_2$ scaffold and holes into the solid-state HTM. Both the $TiO_2$ and the HTM act as selective contacts through which the charge carriers produced by photoexcitation of the perovskite nanoparticles are extracted.

Further work described in WO2013/171517 disclosed how the use of mixed-anion perovskites as a sensitizer/absorber in photovoltaic devices, instead of single-anion perovskites, results in more stable and highly efficient photovoltaic devices. In particular, this document discloses that the superior stability of the mixed-anion perovskites is highlighted by the finding that the devices exhibit negligible colour bleaching during the device fabrication process, whilst also exhibiting full sun power conversion efficiency of over 10%. In comparison, equivalent single-anion perovskites are relatively unstable, with bleaching occurring quickly when fabricating films from the single halide perovskites in ambient conditions.

More recently, WO2014/045021 described planar heterojunction (PHJ) photovoltaic devices comprising a thin film of a photoactive perovskite absorber disposed between n-type (electron transporting) and p-type (hole transporting) layers. Unexpectedly it was found that good device efficiencies could be obtained by using a compact (i.e. without effective/open porosity) thin film of the photoactive perovskite, as opposed to the requirement of a mesoporous composite, demonstrating that perovskite absorbers can function at high efficiencies in simplified device architectures.

Recently some of research into the application of perovskites in photovoltaic devices has focussed on the potential of these materials to boost the performance of conventional silicon-based solar cells by combining them with a perovskite-based cell in a tandem/multi-junction arrangement. In this regard, a multi-junction photovoltaic device comprises multiple separate sub-cells (i.e. each with their own photoactive region) that are "stacked" on top of each other and that together convert more of the solar spectrum into electricity thereby increasing the overall efficiency of the device. To do so, each photoactive region of each sub-cell is selected so that the band gap of the sub-cell ensures that it will efficiently absorbs photons from a specific segment of the solar spectrum. This has two important advantages over conventional single-junction photovoltaic devices. Firstly the combination of multiple photoactive regions/sub-cells with different band gaps ensures that a wider range of incident photons can be absorbed by a multi-junction device, and secondly each photoactive region/sub-cell will be more effective at extracting energy from the photons within the relevant part of the spectrum. In particular, the lowest band gap of a multi-junction photovoltaic device will be lower than that of a typical single junction device, such that a multi-junction device will be able to absorb photons that possess less energy than those that can be absorbed by a single junction device. Furthermore, for those photons that would be absorbed by both a multi-junction device and a single junction device, the multi-junction device will absorb those photons more efficiently, as having band gaps closer to the photon energy reduces thermalization losses.

In a multi-junction device, the top photoactive region/sub-cell in the stack has the highest band gap, with the band gap of the lower photoactive regions/sub-cells reducing towards the bottom of the device. This arrangement maximizes photon energy extraction as the top photoactive region/sub-cell absorbs the highest energy photons whilst allowing the transmission of photons with less energy. Each subsequent photoactive region/sub-cell then extracts energy from photons closest to its band gap thereby minimizing thermalization losses. The bottom photoactive region/sub-cell then absorbs all remaining photons with energy above its band gap. When designing multi-junction cells it is therefore important to choose photoactive regions/sub-cells with the right bandgaps in order to optimise harvesting of the solar spectrum. In this regard, for a tandem photovoltaic device that comprises two photoactive regions/sub-cells, a top photoactive region/sub-cell and a bottom photoactive region/sub-cell, it has been shown that the bottom photoactive region/sub-cell should have a band gap of around 1.1 eV whilst the top photoactive region/sub-cell should have a band gap of around 1.7 eV (Coutts, T et al, (2002). Modeled performance of polycrystalline thin-film tandem solar cells. Progress in Photovoltaics: Research and Applications, 10(3), pp. 195-203).

Consequently, there has been interest in developing hybrid organic-inorganic perovskite solar cells for use in tandem photovoltaic devices given that the band gap of these perovskite materials can be tuned from around 1.5 eV to over 2 eV by varying the halide composition of organometal halide perovskites (Noh, J. et al, (2013). Chemical Management for Colorful, Efficient, and Stable Inorganic—Organic Hybrid Nanostructured Solar Cells. Nano Letters, p.130321112645008). However, to date the stability of the hybrid organic-inorganic perovskite has proven to be a hurdle to their potential use in commercially viable photovoltaic devices. In particular, whilst introducing mixed halides into hybrid perovskite compositions allows for band gap tuning, these mixed halide hybrid perovskites are typically even less stable than the comparable single halide perovskites.

SUMMARY OF THE PRESENT INVENTION

The inventors have developed a photoactive perovskite material that has both a bang gap that makes it suitable for use in multi-junction photovoltaic devices and improved stability. In particular, the inventors have developed a photoactive perovskite material that has a band gap in the region of 1.6 to 2.3 eV, for use in a top sub-cell in a tandem photovoltaic device in combination with a lower band gap bottom sub-cell, and that has improved stability. The inventors have also developed methods and formulations for producing such a photovoltaic device.

The present inventors have surprisingly found that the introduction of small amounts of caesium (Cs+) cations into a formamidinium metal halide perovskite assists in stabilising the crystal structure to the desired phase without causing a reduction in thermal stability of the perovskite. This is particularly surprising as it is unexpected that a mixture of FA and Cs cations would result in a solid perovskite due to the difference in the relative sizes of the FA and Cs cations.

According to a first aspect there is provided a photovoltaic device comprising a photoactive region, the photoactive region comprising a perovskite material of general formula (I):

$$A_{1-x}A'_xBX_{3-y}X'_y \qquad (I)$$

wherein A is a formamidinium (HC(NH2)2+), A' is a caesium cation (Cs$^+$), B is at least one divalent inorganic cation, X is iodide and X' is bromide; and wherein $0<x\leq0.4$ and $0<y\leq3$. The band gap of the perovskite material may be from 1.60 eV to 2.30 eV, and is preferably from 1.65 eV to 1.75 eV.

The divalent inorganic cation B may be any divalent metal cation, and is optionally at least one cation selected from Pb$^{2+}$ and Sn$^{2+}$. Preferably, the divalent inorganic cation B is a lead (II) cation (Pb$^{2+}$).

Preferably the perovskite material has the formula:

$$FA_{1-x}Cs_xPbI_{3-y}Br_y \qquad (II)$$

wherein FA is a formamidinium cation ((HC(NH$_2$)$_2^+$)), Cs is a caesium cation (Cs+), Pb is a lead (II) cation (Pb$^{2+}$), I is iodide (I$^-$) and Br is bromide (Br). Optionally, x is then greater than or equal to 0.05 and less than or equal to 0.25, and is preferably equal to any of 0.05, 0.10, 0.15, 0.20, and 0.25. Optionally, y is greater than 0 and less than 1.5, is more preferably greater than 0 and equal to or less than 1.0, and is yet more preferably greater than 0 and equal to or less than 0.6.

The perovskite material is preferably configured to function as a light absorber/photosensitizer within the photoactive region.

The photoactive region may comprise a thin film of the perovskite material, and preferably the thickness of the thin film of the perovskite material is from 100 nm to 1000 nm, and more preferably from 200 nm to 700 nm, and yet more preferably from 300 nm to 600 nm.

The photoactive region may comprise an n-type region comprising at least one n-type layer, and a layer of the perovskite material in contact with the n-type region. The photoactive region may comprise an n-type region comprising at least one n-type layer, a p-type region comprising at least one p-type layer; and a layer of the perovskite material disposed between the n-type region and the p-type region.

The photoactive region may comprise a layer of the perovskite material without open porosity. The layer of perovskite material may then form a planar heterojunction with one or both of the n-type region and the p-type region.

Alternatively, the layer of the perovskite material may be in contact with a porous scaffold material that is disposed between the n-type region and the p-type region. The porous scaffold material may comprise or consist essentially of any of a dielectric material and a semiconducting/charge transporting material. The layer of the perovskite material may then disposed within pores of/be conformal with a surface of the porous scaffold material. Alternatively, the layer of the perovskite material may fill the pores of the porous scaffold material and form a capping layer on the porous scaffold material, which capping layer consists of a layer of the photoactive material without open porosity.

The photovoltaic device may further comprises a first electrode and a second electrode, with the photoactive region being disposed between the first and second electrodes, wherein the first electrode is in contact with the n-type region of the photoactive region and the second electrode is in contact with the p-type region of the photoactive region. The first electrode may then comprise a transparent or semi-transparent electrically conductive material and the second electrode may comprise a metal. The first electrode may then be an electron collecting electrode, whilst the second electrode is a hole collecting electrode.

The photovoltaic device may further comprise a first electrode and a second electrode, with the photoactive region being disposed between the first and second electrodes, wherein the first electrode is in contact with the p-type region of the photoactive region and the second electrode is in contact with the n-type region of the photoactive region. The first electrode may then comprise a transparent or semi-transparent electrically conductive material, and the second electrode may comprise a metal. The first electrode may then be a hole collecting electrode, whilst the second electrode is an electron collecting electrode.

The photovoltaic device may have a multi-junction structure comprising a first sub-cell disposed over a second sub-cell, the first sub-cell comprising the photoactive region comprising the perovskite material. The photovoltaic device may then have a monolithically integrated structure. In a monolithically integrated multi-junction photovoltaic device the two or more photovoltaic sub-cells are deposited directly onto one another and are therefore electrically connected in series. The photovoltaic device may then further comprise an intermediate region connecting the first sub-cell to the second sub-cell, wherein each intermediate region comprises one or more interconnect layers.

The photovoltaic device having a multi-junction structure may further comprise a first electrode, a second electrode, with the first sub-cell and the second sub-cell disposed between the first and second electrodes.

The first electrode may then be in contact with the p-type region of the first sub-cell, and wherein the first electrode comprises a transparent or semi-transparent electrically conductive material. The first electrode may then be a hole collecting electrode, whilst the second electrode is an electron collecting electrode. In a tandem device, the second electrode will then be in contact with the second sub-cell.

Alternatively, the first electrode may be in contact with the n-type region of the first sub-cell, and wherein the first electrode comprises a transparent or semi-transparent electrically conductive material. The first electrode may then be an electron collecting electrode, whilst the second electrode is a hole collecting electrode. In a tandem device, the second electrode will then be in contact with the second sub-cell.

When the photovoltaic device has a multi-junction structure the second sub-cell of the photovoltaic device may comprise any of a second perovskite material, crystalline silicon, CdTe, CuZnSnSSe, CuZnSnS, or CuInGaSe (CIGS).

According to a second aspect there is provided a method of producing a photovoltaic device comprising a photoactive material, which photoactive material comprises a perovskite of general formula (I):

$$A_{1-x}A'_xBX_{3-y}X'_y \qquad (I)$$

wherein A is a formamidinium cation (HC(NH$_2$)$_2^+$), A' is a caesium cation (Cs$^+$), B is at least one divalent inorganic cation, X is iodide and X' is bromide, and wherein 0<x≤0.4 and 0<y≤3. The method comprises a step (a) of disposing a second region on a first region, which second region comprises a layer of the photoactive material. For example, the first region may be an n-type region comprising at least one n-type layer.

The method may further comprise a step (b) of disposing a third region on the second region. The first region may be an n-type region comprising at least one n-type layer and the third region may then be a p-type region comprising at least one p-type layer. Alternatively, the first region may be a p-type region comprising at least one p-type layer and the third region may then be an n-type region comprising at least one n-type layer.

The step (a) of disposing a second region on the first region may comprise producing a solid layer of the perovskite material by chemical solution deposition. The step of producing a solid layer of the perovskite material by chemical solution deposition may comprises (i) forming a precursor solution comprising precursors of the perovskite material dissolved in a solvent system, (ii) disposing/depositing a layer of the precursor solution, and (iii) removing the solvent system to produce a solid layer of the perovskite material.

The precursors of the perovskite material may comprise a first precursor compound comprising the formamidinium cation (HC(NH$_2$)$_2^+$) (A) and a first halide anion, a second precursor compound comprising the caesium cation (Cs$^+$) (A') and either the first halide anion or a second halide anion, and a third precursor compound comprising the divalent inorganic cation (B) and the second halide anion, wherein the first halide anion is one of iodide (X) and bromide (X') and the second halide is the other of iodide (X) and bromide (X'). The precursors of the perovskite material may further comprise a fourth precursor compound comprising the divalent inorganic cation (B) and the first halide anion.

Alternatively, the precursors of the perovskite material may comprise a first precursor compound comprising the formamidinium cation (HC(NH$_2$)$_2^+$) (A) and a first halide anion, a second precursor compound comprising the formamidinium cation (HC(NH$_2$)$_2^+$) (A) and a sacrificial organic anion (Y), a third precursor compound comprising the caesium cation (Cs$^+$) (A') and either the first halide anion or a second halide anion, and a fourth precursor compound comprising the divalent inorganic cation (B) and a second halide anion, wherein the first halide anion is one of iodide (X) and bromide (X') and the second halide is the other of iodide (X) and iodide (X)). The precursors of the perovskite material may further comprise a fifth precursor compound comprising the divalent inorganic cation (B) and the first halide anion.

The method may then further comprise enabling removal of a volatile compound comprising the sacrificial organic anion (Y) and the formamidinium cation (HC(NH$_2$)$_2^+$) (A) from the deposited layer of the precursor solution. Preferably the step of enabling removal of a volatile compound comprises heating the deposited layer of the precursor solution or exposing the deposited layer of the precursor solution.

The sacrificial organic anion (Y) may be an organic anion of formula RCOO$^-$, ROCOO$^-$, RSO$_3^-$, ROP(O)(OH)O$^-$ or RO$^-$, wherein R is H, substituted or unsubstituted C$_{1-10}$ alkyl, substituted or unsubstituted C$_{2-10}$ alkenyl, substituted or unsubstituted C$_{2-10}$ alkynyl, substituted or unsubstituted C$_{3-10}$ cycloalkyl, substituted or unsubstituted C$_{3-10}$ heterocyclyl or substituted or unsubstituted aryl. Preferably, the sacrificial organic anion (Y) is any of formate (HCOO$^-$), acetate (CH$_3$COO$^-$), propanoate (C$_2$H$_5$COO$^-$), butanoate (C$_3$H$_7$COO$^-$), pentanoate (C$_4$H$_{10}$COO$^-$), and benzoate (C$_6$H$_5$COO$^-$). Preferably, the second precursor compound is any of formamidinium $(HC(NH_2)_2^+)$ acetate, formamidinium $(HC(NH_2)_2^+)$ formate, or formamidinium $(HC(NH_2)_2^+)$ propanoate.

The solvent system may comprise one or more solvents selected from dimethyl sulfoxide (DMSO), N, N-dimethylformamide (DMF), N-cyclohexyl-2-pyrrolidone (CHP), and dimethylacetamide (DMAc), and preferably wherein the solvent system comprises DMF.

Alternatively, the step of producing a solid layer of the perovskite material by chemical solution deposition may comprise (i) forming a first precursor solution comprising one or more precursors of the perovskite material dissolved in a first solvent system, (ii) disposing/depositing a layer of the first precursor solution, (iii) removing the first solvent system to form a solid layer comprising the one or more precursors, (iii) forming a second precursor solution comprising one or more further precursors of the perovskite material dissolved in a second solvent system, and (iv) treating the solid layer comprising the one or more precursors with the second precursor solution and thereby reacting the one or more precursors and the one or more further precursors to produce a solid layer of the perovskite material.

The one or more precursors of the perovskite material may then comprise a first precursor compound comprising the divalent inorganic cation (B) and a first halide anion. The one or more further precursors of the perovskite material may then comprise a second precursor compound comprising the formamidinium cation $(HC(NH_2)_2^+)$ (A) and either the first halide anion or a second halide anion, and a third precursor compound comprising the caesium cation $(Cs^+)$ (A') and the second halide anion, wherein the first halide anion is one of iodide (X) and bromide (X') and the second halide is the other of iodide (X) and bromide (X').

The first solvent system may comprise one or more solvents selected from dimethyl sulfoxide (DMSO), N,N-dimethylformamide (DMF), N-cyclohexyl-2-pyrrolidone (CHP), and dimethylacetamide (DMAc), and preferably wherein the solvent system comprises DMAc. The second solvent system comprises one or more solvents that are capable of dissolving the one or more further precursors and that are orthogonal to the one or more solvents of the first solvent system. Optionally, the second solvent system comprises 2-propanol (IPA).

When the photovoltaic device has a multi-junction structure comprising a first sub-cell and one or more further sub-cells, wherein the first sub-cell comprises the layer of the perovskite material, the method may further comprise providing a further sub-cell, disposing an intermediate region on the further sub-cell, and forming the first sub-cell on the intermediate region.

BRIEF DESCRIPTION OF THE DRAWINGS

The present invention will now be more particularly described by way of example only with reference to the accompanying drawings, in which:

FIG. 2a illustrates schematically a perovskite-based single junction photovoltaic device having a regular structure;

FIG. 2b illustrates schematically a perovskite-based single junction photovoltaic device having an inverted structure;

FIG. 3a illustrates schematically an exemplary perovskite-based single junction photovoltaic device having an extremely thin absorber (ETA) cell architecture;

FIG. 3b illustrates schematically an exemplary perovskite-based single junction photovoltaic device having a meso-superstructured solar cell (MSSC) architecture;

FIG. 3c illustrates schematically an exemplary perovskite-based single junction photovoltaic device having a flat/planar junction architecture;

FIG. 5a illustrates schematically an exemplary perovskite-based tandem photovoltaic device having a crystalline silicon bottom sub-cell;

FIG. 5b illustrates schematically an exemplary perovskite-based tandem photovoltaic device having a CIGS, CIS, or CZTSSe bottom sub-cell;

FIG. 5c illustrates schematically an exemplary perovskite-based tandem photovoltaic device having a bottom sub-cell comprising a second photosensitive/light absorbing perovskite material;

FIGS. 9a and 9b show the UV-Vis absorbance spectra of five different perovskite materials of general formula $MA_{1-x}Cs_xPbI_{3-y}Br_y$;

DETAILED DESCRIPTION

Definitions

Figure 1B:
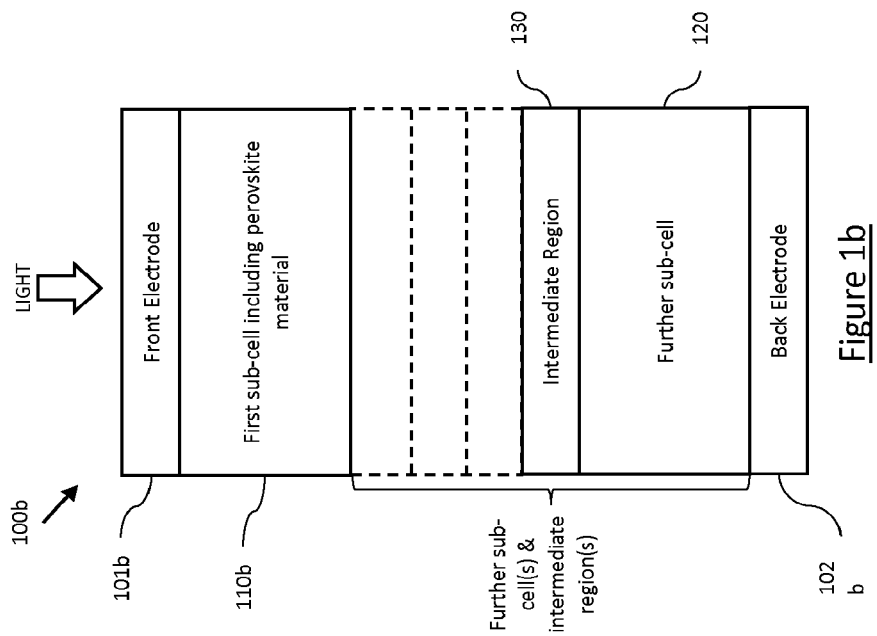
FIG. 1b illustrates schematically a multi-junction photovoltaic device.

The term "photoactive", as used herein, refers to a region, layer or material that is capable of responding to light photoelectrically. A photoactive region, layer or material is therefore capable of absorbing the energy carried by photons in light that then results in the generation of electricity (e.g. by generating either electron-hole pairs or excitons).

The term "perovskite", as used herein, refers to a material with a three-dimensional crystal structure related to that of $CaTiO_3$ or a material comprising a layer of material, which layer has a structure related to that of $CaTiO_3$. The structure of $CaTiO_3$ can be represented by the formula $ABX_3$, wherein A and B are cations of different sizes and X is an anion. In the unit cell, the A cations are at (0,0,0), the B cations are at (½, ½, ½) and the X anions are at (½, ½, 0). The A cation is usually larger than the B cation. The skilled person will appreciate that when A, B and X are varied, the different ion sizes may cause the structure of the perovskite material to distort away from the structure adopted by $CaTiO_3$ to a lower-symmetry distorted structure. The symmetry will also be lower if the material comprises a layer that has a structure related to that of $CaTiO_3$. Materials comprising a layer of perovskite material are well known. For instance, the structure of materials adopting the $K_2NiF_4$ type structure comprises a layer of perovskite material. The skilled person will appreciate that a perovskite material can be represented by the formula [A][B][X]$_3$, wherein [A] is at least one cation, [B] is at least one cation and [X] is at least one anion. When the perovskite comprises more than one A cation, the different A cations may distributed over the A sites in an ordered or disordered way. When the perovskite comprises more than one B cation, the different B cations may distributed over the B sites in an ordered or disordered way. When the perovskite comprise more than one X anion, the different X anions may distributed over the X sites in an ordered or disordered way. The symmetry of a perovskite comprising more than one A cation, more than one B cation or more than one X cation, will often be lower than that of $CaTiO_3$.

As mentioned in the preceding paragraph, the term "perovskite", as used herein, refers to (a) a material with a three-dimensional crystal structure related to that of $CaTiO_3$ or (b) a material comprising a layer of material, wherein the layer has a structure related to that of $CaTiO_3$. Although both of these categories of perovskite may be used in the devices according to the invention, it is preferable in some circumstances to use a perovskite of the first category, (a), i.e. a perovskite having a three-dimensional (3D) crystal structure. Such perovskites typically comprise a 3D network of perovskite unit cells without any separation between layers. Perovskites of the second category, (b), on the other hand, include perovskites having a two-dimensional (2D) layered structure. Perovskites having a 2D layered structure may comprise layers of perovskite unit cells that are separated by (intercalated) molecules; an example of such a 2D layered perovskite is [2-(1-cyclohexenyl)ethylammonium]$_2$PbBr$_4$. 2D layered perovskites tend to have high exciton binding energies, which favours the generation of bound electron-hole pairs (excitons), rather than free charge carriers, under photoexcitation. The bound electron-hole pairs may not be sufficiently mobile to reach the p-type or n-type contact where they can then transfer (ionise) and generate free charge. Consequently, in order to generate free charge, the exciton binding energy has to be overcome, which represents an energetic cost to the charge generation process and results in a lower voltage in a photovoltaic cell and a lower efficiency. In contrast, perovskites having a 3D crystal structure tend to have much lower exciton binding energies (on the order of thermal energy) and can therefore generate free carriers directly following photoexcitation. Accordingly, the perovskite semiconductor employed in the devices and processes of the invention is preferably a perovskite of the first category, (a), i.e. a perovskite which has a three-dimensional crystal structure. This is particularly preferable when the optoelectronic device is a photovoltaic device.

The perovskite material employed in the present invention is one which is capable of absorbing light and thereby generating free charge carriers. Thus, the perovskite employed is a light-absorbing perovskite material. However, the skilled person will appreciate that the perovskite material could also be a perovskite material that is capable of emitting light, by accepting charge, both electrons and holes, which subsequently recombine and emit light. Thus, the perovskite employed may be a light-emitting perovskite.

As the skilled person will appreciate, the perovskite material employed in the present invention may be a perovskite which acts as an n-type, electron-transporting semiconductor when photo-doped. Alternatively, it may be a perovskite which acts as a p-type hole-transporting semiconductor when photo-doped. Thus, the perovskite may be n-type or p-type, or it may be an intrinsic semiconductor. In preferred embodiments, the perovskite employed is one which acts as an n-type, electron-transporting semiconductor when photo-doped. The perovskite material may exhibit ambipolar charge transport, and therefore act as both n-type and p-type semiconductor. In particular, the perovskite may act as both n-type and p-type semiconductor depending upon the type of junction formed between the perovskite and an adjacent material.

Typically, the perovskite semiconductor used in the present invention is a photosensitizing material, i.e. a material which is capable of performing both photogeneration and charge transportation.

The term "mixed-anion", as used herein, refers to a compound comprising at least two different anions. The term "halide" refers to an anion of an element selected from Group 17 of the Periodic Table of the Elements, i.e., of a halogen. Typically, halide anion refers to a fluoride anion, a chloride anion, a bromide anion, an iodide anion or an astatide anion.

The term "metal halide perovskite", as used herein, refers to a perovskite, the formula of which contains at least one metal cation and at least one halide anion. The term "organometal halide perovskite", as used herein, refers to a metal halide perovskite, the formula of which contains at least one organic cation.

The term "organic material" takes its normal meaning in the art. Typically, an organic material refers to a material comprising one or more compounds that comprise a carbon atom. As the skilled person would understand it, an organic compound may comprise a carbon atom covalently bonded to another carbon atom, or to a hydrogen atom, or to a halogen atom, or to a chalcogen atom (for instance an oxygen atom, a sulphur atom, a selenium atom, or a tellurium atom). The skilled person will understand that the term "organic compound" does not typically include compounds that are predominantly ionic such as carbides, for instance.

The term "organic cation" refers to a cation comprising carbon. The cation may comprise further elements, for example, the cation may comprise hydrogen, nitrogen or oxygen.

The term "semiconductor", as used herein, refers to a material with electrical conductivity intermediate in magnitude between that of a conductor and a dielectric. A semiconductor may be an n-type semiconductor, a p-type semiconductor or an intrinsic semiconductor.

The term "dielectric", as used herein, refers to material which is an electrical insulator or a very poor conductor of electric current. The term dielectric therefore excludes semiconducting materials such as titania. The term dielectric, as used herein, typically refers to materials having a band gap of equal to or greater than 4.0 eV (The band gap of titania is about 3.2 eV.)

The term "n-type", as used herein, refers to a region, layer or material that comprises an extrinsic semiconductor with a larger concentration of electrons than holes. In n-type semiconductors, electrons are therefore majority carriers and holes are the minority carriers, and they are therefore electron transporting materials. The term "n-type region", as used herein, therefore refers to a region of one or more electron transporting (i.e. n-type) materials. Similarly, the term "n-type layer" refers to a layer of an electron-transporting (i.e. an n-type) material. An electron-transporting (i.e. an n-type) material could be a single electron-transporting compound or elemental material, or a mixture of two or more electron-transporting compounds or elemental materials. An electron-transporting compound or elemental material may be undoped or doped with one or more dopant elements.

The term "p-type", as used herein, refers to a region, layer or material that comprises an extrinsic semiconductor with a larger concentration of holes than electrons. In p-type semiconductors, holes are the majority carriers and electrons are the minority carriers, and they are therefore hole transporting materials. The term "p-type region", as used herein, therefore refers to a region of one or more hole transporting (i.e. p-type) materials. Similarly, the term "p-type layer" refers to a layer of a hole-transporting (i.e. a p-type) material. A hole-transporting (i.e. a p-type) material could be a single hole-transporting compound or elemental material, or a mixture of two or more hole-transporting compounds or elemental materials. A hole-transporting compound or elemental material may be undoped or doped with one or more dopant elements.

The term "band gap", as used herein, refers to the energy difference between the top of the valence band and the bottom of the conduction band in a material. The skilled person may readily measure the band gap of a material without undue experimentation.

The term "layer", as used herein, refers to any structure which is substantially laminar in form (for instance extending substantially in two perpendicular directions, but limited in its extension in the third perpendicular direction). A layer may have a thickness which varies over the extent of the layer. Typically, a layer has approximately constant thickness. The "thickness" of a layer, as used herein, refers to the average thickness of a layer. The thickness of layers may easily be measured, for instance by using microscopy, such as electron microscopy of a cross section of a film, or by surface profilometry for instance using a stylus profilometer.

The term "porous", as used herein, refers to a material within which pores are arranged. Thus, for instance, in a porous material the pores are volumes within the body of the material where there is no material. The individual pores may be the same size or different sizes. The size of the pores is defined as the "pore size". The limiting size of a pore, for most phenomena in which porous solids are involved, is that of its smallest dimension which, in the absence of any further precision, is referred to as the width of the pore (i.e. the width of a slit-shaped pore, the diameter of a cylindrical or spherical pore, etc.). To avoid a misleading change in scale when comparing cylindrical and slit-shaped pores, one should use the diameter of a cylindrical pore (rather than its length) as its "pore-width" (Rouquerol, J. et al, (1994) Recommendations for the characterization of porous solids (Technical Report). Pure and Applied Chemistry, 66(8)). The following distinctions and definitions were adopted in previous IUPAC documents (J. Haber. (1991) Manual on catalyst characterization (Recommendations 1991). Pure and Applied Chemistry.): micropores have widths (i.e. pore sizes) smaller than 2 nm; Mesopores have widths (i.e. pore sizes) of from 2 nm to 50 nm; and Macropores have widths (i.e. pore sizes) of greater than 50 nm. In addition, nanopores may be considered to have widths (i.e. pore sizes) of less than 1 nm.

Pores in a material may include "closed" pores as well as open pores. A closed pore is a pore in a material which is a non-connected cavity, i.e. a pore which is isolated within the material and not connected to any other pore and which cannot therefore be accessed by a fluid to which the material is exposed. An "open pore" on the other hand, would be accessible by such a fluid. The concepts of open and closed porosity are discussed in detail in J. Rouquerol et al.

Open porosity, therefore, refers to the fraction of the total volume of the porous material in which fluid flow could effectively take place. It therefore excludes closed pores. The term "open porosity" is interchangeable with the terms "connected porosity" and "effective porosity", and in the art is commonly reduced simply to "porosity". The term "without open porosity", as used herein, therefore refers to a material with no effective porosity. Thus, a material without open porosity typically has no macropores and no mesopores. A material without open porosity may comprise micropores and nanopores, however. Such micropores and nanopores are typically too small to have a negative effect on a material for which low porosity is desired.

In addition, polycrystalline materials are solids that are composed of a number of separate crystallites or grains, with grain boundaries at the interface between any two crystallites or grains in the material. A polycrystalline material can therefore have both interparticle/interstitial porosity and intraparticle/internal porosity. The terms "interparticle porosity" and "interstitial porosity", as used herein, refer to pores between the crystallites or grains of the polycrystalline material (i.e. the grain boundaries), whilst the terms "intraparticle porosity" and "internal porosity", as used herein, refer to pores within the individual crystallites or grains of the polycrystalline material. In contrast, a single crystal or monocrystalline material is a solid in which the crystal lattice is continuous and unbroken throughout the volume of the material, such that there are no grain boundaries and no interparticle/interstitial porosity.

The term "compact layer", as used herein, refers to a layer without mesoporosity or macroporosity. A compact layer may sometimes have microporosity or nanoporosity.

The term "scaffold material", as used herein, therefore refers to a material that is capable of acting as a support for a further material. The term "porous scaffold material", as used herein, therefore refers to a material which is itself porous, and which is capable of acting as a support for a further material.

The term "transparent", as used herein, refers to material or object allows visible light to pass through almost undisturbed so that objects behind can be distinctly seen. The term "semi-transparent", as used herein, therefore refers to material or object which has a transmission (alternatively and equivalently referred to as a transmittance) to visible light intermediate between a transparent material or object and an opaque material or object. Typically, a transparent material will have an average transmission for visible light (generally light with a wavelength of from 370 to 740 nm) of around 100%, or from 90 to 100%. Typically, an opaque material will have an average transmission for visible light of around 0%, or from 0 to 5%. A semi-transparent material or object will typically have an average transmission for visible light of from 10 to 90%, typically 40 to 60%. Unlike many translucent objects, semi-transparent objects do not typically distort or blur images. Transmission for light may be measured using routine methods, for instance by comparing the intensity of the incident light with the intensity of the transmitted light.

The term "electrode", as used herein, refers to a conductive material or object through which electric current enters or leaves an object, substance, or region. The term "negative electrode", as used herein, refers to an electrode through which electrons leave a material or object (i.e. an electron collecting electrode). A negative electrode is typically referred to as an "anode". The term "positive electrode", as used herein, refers to an electrode through which holes leave a material or object (i.e. a hole collecting electrode). A positive electrode is typically referred to as a "cathode". Within a photovoltaic device, electrons flow from the positive electrode/cathode to the negative electrode/anode, whilst holes flow from the negative electrode/anode to the positive electrode/cathode.

The term "front electrode", as used herein, refers to the electrode provided on that side or surface of a photovoltaic device that it is intended will be exposed to sun light. The front electrode is therefore typically required to be transparent or semi-transparent so as to allow light to pass through the electrode to the photoactive layers provided beneath the front electrode. The term "back electrode", as used herein, therefore refers to the electrode provided on that side or surface of a photovoltaic device that is opposite to the side or surface that it is intended will be exposed to sun light.

The term "charge transporter" refers to a region, layer or material through which a charge carrier (i.e. a particle carrying an electric charge), is free to move. In semiconductors, electrons act as mobile negative charge carriers and holes act as mobile positive charges. The term "electron transporter" therefore refers to a region, layer or material through which electrons can easily flow and that will typically reflect holes (a hole being the absence of an electron that is regarded as a mobile carrier of positive charge in a semiconductor). Conversely, the term "hole transporter" refers to a region, layer or material through which holes can easily flow and that will typically reflect electrons.

The term "consisting essentially of" refers to a composition comprising the components of which it consists essentially as well as other components, provided that the other components do not materially affect the essential characteristics of the composition. Typically, a composition consisting essentially of certain components will comprise greater than or equal to 95 wt % of those components or greater than or equal to 99 wt % of those components.

The term "volatile compound", as used herein, refers to a compound which is easily removed by evaporation or decomposition. For instance a compound which is easily removed by evaporation or decomposition at a temperature of less than or equal to 150° C., or for instance at a temperature of less than or equal to 100° C., would be a volatile compound. "Volatile compound" also includes compounds which are easily removed by evaporation via decomposition products. Thus, a volatile compound X may evaporate easily thorough evaporation of molecules of X, or a volatile compound X may evaporate easily by decomposing to form two compounds Y and Z which evaporate easily. For instance, ammonium salts can be volatile compounds, and may either evaporate as molecules of the ammonium salt or as decomposition products, for instance ammonium and a hydrogen compound (e.g. a hydrogen halide). Thus, a volatile compound X may have a relatively high vapour pressure (e.g. greater than or equal to 500 Pa) or may have a relatively high decomposition pressure (e.g. greater than or equal to 500 Pa for one or more of the decomposition products), which may also be referred to as a dissociation pressure.

Device Structure

Figure 1A:
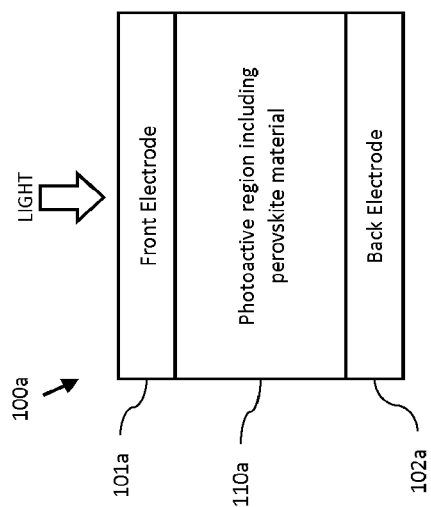
FIG. 1a illustrates schematically a single junction photovoltaic device.

FIGS. 1a and 1b illustrate schematically photovoltaic devices 100a, 100b according to the present invention. In FIGS. 1a and 1b, the photovoltaic devices 100a, 100b each comprise a transparent or semi-transparent front electrode 101a, 101b and a back electrode 102a, 102b, with a photoactive region 110a, 110b disposed between the front and back electrodes, wherein the photoactive region comprising a perovskite material of general formula (I):

$$A_{1-x}A'_xBX_{3-y}X'_y \qquad (I)$$

wherein A is a formamidinium cation $(HC(NH_2)_2^+)$, A' is a caesium cation $(Cs^+)$, B is at least one divalent inorganic cation, and X is iodide and X' is bromide, with the value of x being greater than 0 and equal to or less than 0.4 and the value of y being greater than 0 and less than or equal to 3.

The perovskite material is configured to function as a light absorber/photosensitizer within the photoactive region. In addition, the perovskite material in the photoactive region may also be configured to provide charge transport. In this regard, perovskite materials are able to act not only a light absorber (i.e. photosensitizer) but also as an n-type, p-type or intrinsic (i-type) semiconductor material (charge transporter). A perovskite material can therefore act both as a photosensitizer and as the n-type semiconductor material. The perovskite material may therefore assume the roles both of light absorption and long range charge transport.

In FIG. 1a the illustrated photovoltaic device 100a includes a single a photoactive region 110a disposed between the front 101a and back electrodes 102a, wherein the photoactive region 110a comprises a perovskite material of general formula (I). FIG. 1a therefore illustrates a single junction photovoltaic device.

FIG. 1b then illustrates a multi-junction photovoltaic device 100b that includes a first sub-cell 110b in which the photoactive region comprises a perovskite material of general formula (I) and one or more further sub-cells 120 disposed between the front 101b and back electrodes 102b. In particular, FIG. 1b illustrates a monolithically integrated multi-junction photovoltaic device wherein each sub-cell 110b, 120 is connected to an adjacent sub-cell by an intermediate region 130 comprising one or more interconnect layers (e.g. a recombination layer or a tunnel junction). In a monolithically integrated multi-junction photovoltaic device the individual sub-cells are electrically connected in series, which results in the need for a recombination layer or a tunnel junction and current matching. In contrast, in a mechanically stacked multi-junction photovoltaic device the individual sub-cells are provided with separate electrical contacts and therefore do not require current matching. However, the additional size and cost of the additional contacts and substrates, and heat dispersing difficulties make mechanically stacked structures less favourable than monolithically integrated structures.

FIGS. 2a and 2b illustrate schematically separate embodiments of single junction photovoltaic devices 100a having a photoactive region 110a comprising a perovskite material of general formula (I). In each of these embodiments, the photoactive region 110a comprises an n-type region 111a comprising at least one n-type layer, a p-type region 112a comprising at least one p-type layer, and a layer of the perovskite material 113a disposed between the n-type region and the p-type region.

The n-type region comprises one or more n-type layers. Often, the n-type region is an n-type layer, i.e. a single n-type layer. In other embodiments, however, the n-type region may comprise an n-type layer and a separate n-type exciton blocking layer or hole blocking layer.

An exciton blocking layer is a material which is of wider band gap than the photoactive material, but has either its conduction band or valance band closely matched with those of the photoactive material. If the conduction band (or lowest unoccupied molecular orbital energy levels) of the exciton blocking layer are closely aligned with the conduction band of the photoactive material, then electrons can pass from the photoactive material into and through the exciton blocking layer, or through the exciton blocking layer and into the photoactive material, and we term this an n-type exciton blocking layer. An example of such is bathocuproine (BCP), as described in P. Peumans, A. Yakimov, and S. R. Forrest, "Small molecular weight organic thin-film photodetectors and solar cells" J. Appl. Phys. 93, 3693 (2001) and Masaya Hirade, and Chihaya Adachi, "Small molecular organic photovoltaic cells with exciton blocking layer at anode interface for improved device performance" Appl. Phys. Lett. 99, 153302 (2011)}.

An n-type layer is a layer of an electron-transporting (i.e. an n-type) material. An n-type material may be a single n-type compound or elemental material, or a mixture of two or more n-type compounds or elemental materials, which may be undoped or doped with one or more dopant elements. An n-type layer may comprise an inorganic or an organic n-type material.

A suitable inorganic n-type material may be selected from a metal oxide, a metal sulphide, a metal selenide, a metal telluride, a perovskite, amorphous Si, an n-type group IV semiconductor, an n-type group III-V semiconductor, an n-type group II-VI semiconductor, an n-type group I-VII semiconductor, an n-type group IV-VI semiconductor, an n-type group V-VI semiconductor, and an n-type group II-V semiconductor, any of which may be doped or undoped. Typically, the n-type material is selected from a metal oxide, a metal sulphide, a metal selenide, and a metal telluride. Thus, the n-type material may comprise an inorganic material selected from oxide of titanium, tin, zinc, niobium, tantalum, tungsten, indium, gallium, neodymium, palladium, cadmium, or an oxide of a mixture of two or more of said metals; a sulphide of cadmium, tin, copper, zinc or a sulphide of a mixture of two or more of said metals; a selenide of cadmium, zinc, indium, gallium or a selenide of a mixture of two or more of said metals; or a telluride of cadmium, zinc, cadmium or tin, or a telluride of a mixture of two or more of said metals.

Examples of other semiconductors that may be suitable n-type materials, for instance if they are n-doped, include group IV elemental or compound semiconductors; amorphous Si; group III-V semiconductors (e.g. gallium arsenide); group II-VI semiconductors (e.g. cadmium selenide); group I-VII semiconductors (e.g. cuprous chloride); group IV-VI semiconductors (e.g. lead selenide); group V-VI semiconductors (e.g. bismuth telluride); and group II-V semiconductors (e.g. cadmium arsenide).

Other n-type materials may also be employed, including organic and polymeric electron transporting materials, and electrolytes. Suitable examples include, but are not limited to, a fullerene or a fullerene derivative, an organic electron transporting material comprising perylene or a derivative thereof, or poly{[N, NO-bis(2-octyldodecyl)-naphthalene-1, 4,5,8-bis(dicarboximide)-2,6-diyl]-alt-5,50-(2,20-bithiophene)} (P(NDI2OD-T2)).

The p-type region comprises one or more p-type layers. Often, the p-type region is a p-type layer, i.e. a single p-type layer. In other embodiments, however, the p-type region may comprise a p-type layer and a p-type exciton blocking layer or electron blocking layer. If the valence band (or highest occupied molecular orbital energy levels) of the exciton blocking layer is closely aligned with the valence band of the photoactive material, then holes can pass from the photoactive material into and through the exciton blocking layer, or through the exciton blocking layer and into the photoactive material, and we term this a p-type exciton blocking layer. An example of such is tris[4-(5-phenylthiophen-2-yl)phenyl]amine, as described in Masaya Hirade, and Chihaya Adachi, "Small molecular organic photovoltaic cells with exciton blocking layer at anode interface for improved device performance" Appl. Phys. Lett. 99, 153302 (2011).

A p-type layer is a layer of a hole-transporting (i.e. a p-type) material. The p-type material may be a single p-type compound or elemental material, or a mixture of two or more p-type compounds or elemental materials, which may be undoped or doped with one or more dopant elements. A p-type layer may comprise an inorganic or an organic p-type material.

Suitable p-type materials may be selected from polymeric or molecular hole transporters. Suitable p-type materials include molecular hole transporters, polymeric hole transporters and copolymer hole transporters. A p-type material may for instance be a molecular hole transporting material, a polymer or copolymer comprising one or more of the following moieties: thiophenyl, phenelenyl, dithiazolyl, benzothiazolyl, diketopyrrolopyrrolyl, ethoxydithiophenyl, amino, triphenyl amino, carbozolyl, ethylene dioxythiophenyl, dioxythiophenyl, or fluorenyl. Thus, a p-type material employed in the photovoltaic device of the invention may for instance comprise any of the aforementioned molecular hole transporting materials, polymers or copolymers. In one embodiment, the p-type regions comprises a hole transport material.

A p-type layer of the photovoltaic device may comprise spiro-OMeTAD (2,2',7,7'-tetrakis-(N,N-di-p-methoxyphenylamine)-9,9'-spirobifluorene)), P3HT (poly(3-hexylthiophene)), PCPDTBT (Poly[2,1,3-benzothiadiazole-4,7-diyl [4,4-bis(2-ethylhexyl)-4H-cyclopenta[2,1-b:3,4-b'] dithiophene-2,6-diyl]]), PVK (poly(N-vinylcarbazole)), poly(3-hexylthiophene), poly[N,N-di phenyl-4-methoxyphenylamine-4',4"-diyl], sexithiophene, 9,10-bis(phenylethynyl)anthracene, 5,12-bis(phenylethynyl)naphthacene, diindenoperylene, 9,10-diphenylanthracene, PEDOT-TMA, PEDOT:PSS, perfluoropentacene, perylene, poly(pphenylene oxide), poly(p-phenylene sulfide), quinacridone, rubrene, 4-(dimethylamino)benzaldehyde diphenylhydrazone, 4-(dibenzylamino)benzaldehyde-N,Ndiphenylhydrazone or phthalocyanines.

The device illustrated in FIG. 2a has what is considered a regular structure for a perovskite-based single junction photovoltaic device wherein the front electrode 101a is in contact with the n-type region 111a of the photoactive region 110a and the back electrode 102a is in contact with the p-type region 112a of the photoactive region 110a (Docampo, P et al. (2013) Efficient organometal trihalide perovskite planar-heterojunction solar cells on flexible polymer substrates. Nat Comms, 4). The front electrode 101a therefore functions as a negative (electron collecting) electrode, whilst the back electrode 102a functions as a positive (hole collecting) electrode.

By way of example, in the exemplary device structure illustrated in FIG. 2a the front electrode may comprise a transparent conductive oxide (TCO) such as tin-doped indium-oxide (ITO), fluorine doped tin oxide (FTO) etc., the n-type region may comprise one or more layers of n-type material (e.g. where each layer of n-type material may comprise an n-type material selected from those detailed above), the p-type region may comprise one or more layers of p-type material (e.g. where each layer of p-type material may comprise a p-type material selected from those detailed above), and the back electrode may comprise a high work function metal such as gold (Au) silver (Ag), nickel (Ni), palladium (Pd), platinum (Pt) or aluminium (Au).

In contrast, the device illustrated in FIG. 2b has what is considered to be an inverted structure for a perovskite-based single junction photovoltaic device wherein the front electrode 101a is in contact with the p-type region 112a of the photoactive region 110a and the back electrode 102a is in contact with the n-type region 111a of the photoactive region 110a. The front electrode 101a therefore functions as positive (hole collecting) electrode, whilst the back electrode 102a functions as a negative (electron collecting) electrode.

By way of example, in the exemplary device structure illustrated in FIG. 2b the front electrode may comprise a transparent conductive oxide (TCO) such as tin-doped indium-oxide (ITO), fluorine doped tin oxide (FTO) etc., the p-type region may comprise one or more layers of p-type material (e.g. where each layer of p-type material may comprise a p-type material selected from those detailed above), the n-type region may comprise one or more layers of n-type material (e.g. where each layer of n-type material may comprise an n-type material selected from those detailed above), and the back electrode may comprise a high work function metal such as gold (Au) silver (Ag), nickel (Ni), palladium (Pd), platinum (Pt) or aluminium (Au).

Both of the devices illustrated in FIGS. 2a and 2b include an n-type region and a p-type region, with the photoactive perovskite material disposed between the n-type region and the p-type region, such that the n-type (electron-transporting) region and the p-type (hole-transporting) region act to transport charge generated in the perovskite material towards the respective electrodes. However, it is also possible for such devices to include only one charge transporting region. In particular, it has been shown that functional photovoltaic devices comprising a photoactive perovskite can be formed without any hole-transporting materials, such that the photoactive perovskite is in direct contact with an electrode and/or metal layer (see Etgar, L., Gao, P. & Xue, Z., 2012. Mesoscopic CH3NH3PbI3/TiO2 heterojunction solar cells. J. Am. Chem. Soc., 2012, 134 (42), pp 17396-17399). In such devices, the photoactive perovskite assumes the roles of both light harvester and hole transporter, such that an additional hole transporting material is redundant.

FIGS. 3a to 3c illustrate some exemplary embodiments of a perovskite-based single junction photovoltaic device.

In FIGS. 3a and 3b, the photoactive region 110a of the photovoltaic device 100a comprises a porous region 114a, wherein the porous region 114a comprises a layer of the perovskite material 113a of formula (I) that is in contact with a porous scaffold material 115a that is disposed between the n-type region 111a and the p-type region 112a. In this embodiment, the layer of the perovskite material 113a is provided as a coating on the porous scaffold material 115a, thereby forming a substantially conformal layer on the surface of the porous scaffold, such that the perovskite material 113a is disposed within pores of the porous scaffold. The p-type region 112a comprises a charge transporting material then fills the pores of porous region 114a (i.e. the pores of the perovskite-coated porous scaffold) and forms a capping layer over the porous material. In this regard, the capping layer of charge transporting material consists of a layer of the charge transporting material without open porosity.

In FIG. 3a, the illustrated photovoltaic device 100a has what has been referred to as an extremely thin absorber (ETA) cell architecture in which an extremely thin layer of the light absorbing perovskite material is provided at the interface between nanostructured, interpenetrating n-type (e.g. $TiO_2$) and p-type semiconductors (e.g. HTM). In this arrangement, the porous scaffold material 115a within the photoactive region 110a comprises a semiconducting/charge transporting material.

In FIG. 3b, the illustrated photovoltaic device 100a has what has been referred to as a meso-superstructured solar cell (MSSC) architecture in which an extremely thin layer of the light absorbing perovskite material is provided on a mesoporous insulating scaffold material. In this arrangement, the porous scaffold material 115a within the photoactive region 110a comprise a dielectric material (e.g. $Al_2O_3$).

In FIG. 3c, the photoactive region 110a comprises a layer of the perovskite material 113a of formula (I) without open porosity. As described above, a material without open porosity typically has no macropores and no mesopores, but may have micropores and nanopores (and therefore may have intercrystalline pores). The layer of perovskite material 113a therefore forms a planar heterojunction with one or both of the n-type region 111a and the p-type region 112a. Either the n-type region 111a or the p-type region 112a may be disposed on the layer of the perovskite material 113a without open porosity. In this regard, as the layer of the perovskite material 113a is without open porosity, no n-type or p-type material infiltrates the perovskite material to form a bulk heterojunction; rather it forms a planar heterojunction with the perovskite material. Typically, the layer of the perovskite material 113a without open porosity is in contact with both the n-type region and the p-type region, and therefore forms a planar heterojunction with both the n-type region and the p-type region.

In FIG. 3c, the illustrated photovoltaic device 100a therefore has a thin film planar heterojunction device architecture in which a solid thin layer of the light absorbing perovskite material is provided between planar layers of n-type (e.g. $TiO_2$) and p-type semiconductors (e.g. HTM). In this arrangement, the device does not include a porous scaffold material.

In an alternative embodiment, the photoactive region may comprise a layer of the perovskite material of formula (I) wherein the perovskite material fills the pores of a porous scaffold material and forms a capping layer of the perovskite material over the porous scaffold material, wherein the capping layer of the perovskite material is not infiltrated by the porous scaffold material. The layer of the perovskite material is therefore in contact with the porous scaffold material. Typically, the capping layer consists of a layer of the perovskite material without open porosity that therefore forms a planar heterojunction with one of the n-type region and the p-type region.

In a yet further embodiment, the photoactive region may comprise a layer of the perovskite material of formula (I) wherein the perovskite material is itself porous. A charge transporting material then fills the pores of porous region of perovskite material and forms a capping layer over the porous perovskite material. In this regard, the capping layer of charge transporting material consists of a layer of the charge transporting material without open porosity.

Depending upon the specific arrangement of the device, the thickness of the photoactive region is typically from 300 nm to 3000 nm. Usually, the thickness of the photoactive region is from 400 nm to 2000 nm. For instance the thickness may be from 500 nm to 1500 nm.

In order to provide highly efficient photovoltaic devices, the absorption of the absorber should ideally be maximised so as to generate an optimal amount of current. Consequently, when using a perovskite as the absorber in a photovoltaic device, the thickness of the perovskite layer should ideally be in the order of from 300 to 600 nm, in order to absorb most of the sun light across the visible spectrum. In particular, in a solar cell the perovskite layer should generally be thicker than the absorption depth (which is defined as the thickness of film required to absorb 90% of the incident light of a given wavelength, which for the perovskite materials of interest is typically above 100 nm if significant light absorption is required across the whole visible spectrum (400 to 800 nm)), as the use of a photoactive layer in photovoltaic devices with a thickness of less than 100 nm can be detrimental to the performance of the device.

Typically, therefore, the thickness of the layer of the perovskite material is greater than 100 nm. The thickness of the layer of the perovskite material in the photovoltaic device may for instance be from 100 nm to 1000 nm. The thickness of the layer of the perovskite material in the photovoltaic device may for instance be from 200 nm to 700 nm, and is preferably from 300 nm to 600 nm.

The front electrode may have a thickness of from 100 nm to 700 nm, for instance of from 100 nm to 400 nm. For instance the thickness may be 400 nm. The back electrode may have a thickness of from 10 nm to 500 nm, for instance from 50 nm to 200 nm. For instance, the thickness of the back electrode may be 150 nm.

The n-type region comprises one or more n-type layers. The n-type region may have a thickness of from 50 nm to 1000 nm. For instance, the n-type region may have a thickness of from 50 nm to 500 nm, or from 100 nm to 500 nm. Where the n-type region comprises a compact layer of an n-type semiconductor, the compact layer has a thickness of from 50 nm to 200 nm, typically a thickness of about 100 nm.

The p-type region comprises one or more p-type layers. The p-type region may have a thickness of from 50 nm to 1000 nm. For instance, the p-type region may have a thickness of from 50 nm to 500 nm, or from 100 nm to 500 nm.

Where the photoactive region comprises a porous scaffold material, the thickness of the layer of the porous scaffold material may have a thickness of from 5 nm to 500 nm, or from 100 nm to 300 nm. For instance, the thickness of the layer of the porous scaffold may be from 10 nm to 50 nm.

Where the photoactive region comprises a capping layer of the perovskite material over a porous region, the thickness of the capping layer can be greater than, equal to, or less than the thickness of the porous region. The thickness of the capping layer is typically from 10 nm to 1000 nm, or for instance from 100 nm to 700 nm. A capping layer having a thickness of at least 100 nm is usually preferred. The thickness of the porous region is often from 5 nm to 1000 nm. More typically, it is from 5 nm to 500 nm, or for instance from 30 nm to 200 nm.

Figure 4B:
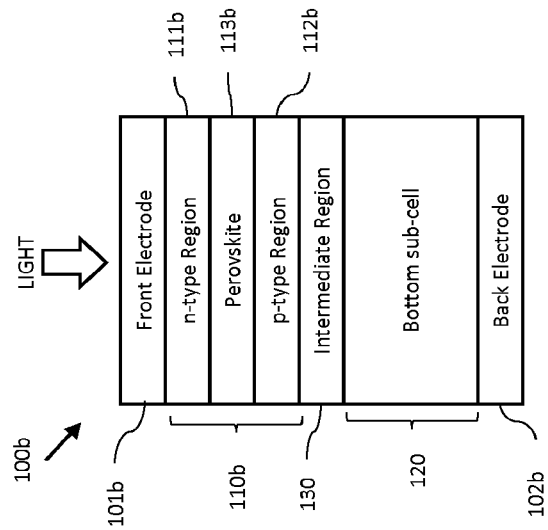
FIG. 4b illustrates schematically a perovskite-based multi-junction photovoltaic device having an inverted structure.
Figure 4A:
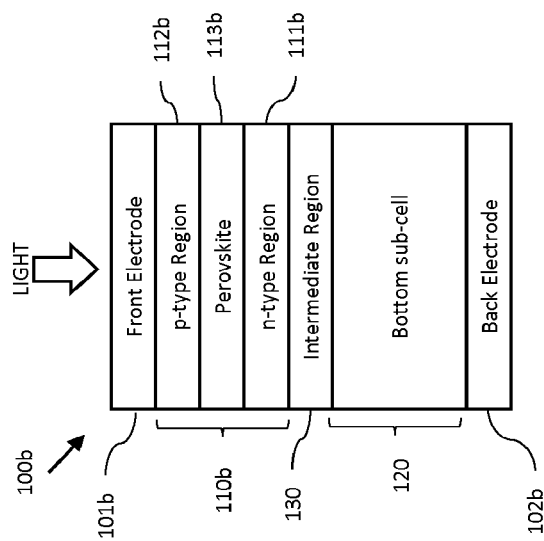
FIG. 4a illustrates schematically a perovskite-based multi-junction photovoltaic device having a regular structure.

FIGS. 4a and 4b illustrate schematically separate embodiments of multi-junction photovoltaic devices 100b having a first sub-cell 110b comprising a perovskite material of general formula (I) and one or more further sub-cells 120.

In each of these embodiments, the multi-junction photovoltaic device 100b has a monolithically integrated structure that therefore comprises just two electrodes, the front 101b and back electrodes 102b, with the first sub-cell 110b and the one or more further sub-cells 120 disposed between these two electrodes. Furthermore, as the monolithically integrated structure comprises just two electrodes, each sub-cell is connected to an adjacent photoactive region by an intermediate region 130, wherein each intermediate region comprises one or more interconnect layers. For example, the interconnect layer(s) can comprise any of a recombination layer and a tunnel junction.

In each of these embodiments, the first sub-cell 110b further comprises an n-type region 111b comprising at least one n-type layer, a p-type region 112b comprising at least one p-type layer, with a layer of the perovskite material 113b disposed between the n-type region 111b and the p-type region 112b.

By way of example, each of the one or more further sub-cells 120 of the multi-junction photovoltaic device 100b may comprise any of a second photoactive perovskite material, amorphous silicon, crystalline silicon, CdTe, CuZnSnSSe, CuZnSnS, or CuInGaSe (CIGS).

The device illustrated in FIG. 4a has what is considered a regular structure for a perovskite-based multi-junction photovoltaic device 100b, wherein the front electrode 101b is in contact with the p-type region 112b of the first sub-cell 110b comprising the perovskite material 113b of general formula (I) and the back electrode 102b is in contact with one of the one or more further sub-cells 120. The front electrode 101b therefore functions as a positive (hole collecting) electrode, whilst the back electrode 102b functions as a negative (electron collecting) electrode In FIG. 4a the illustrated multi-junction photovoltaic device 100b is a tandem device comprising two photoactive sub-cells 110b, 120, wherein the top/upper/first sub-cell 110b comprises a photosensitive/light absorbing perovskite material 113b of formula (I) and the bottom/lower/second sub-cell 120 can, for example, comprise a crystalline silicon-based sub-cell.

By way of example, in this exemplary structure the front electrode 101b may comprise a transparent conductive oxide (TCO) such as tin-doped indium-oxide (ITO), fluorine doped tin oxide (FTO) etc., the p-type region 112b may comprise one or more layers of p-type material (e.g. where each layer of p-type material may comprise a p-type material selected from those detailed above), the n-type region 111b may comprise one or more layers of n-type material (e.g. where each layer of n-type material may comprise an n-type material selected from those detailed above), and the back electrode 102b may comprise a high work function metal such as gold (Au) silver (Ag), nickel (Ni), palladium (Pd), platinum (Pt) or aluminium (Au). By way of example, the intermediate region 130 could comprise a recombination layer comprising a layer of ITO.

In contrast, the device illustrated in FIG. 4b has what is considered to be an inverted structure for a perovskite-based multi-junction photovoltaic device 100b wherein the front electrode 101b is in contact with the n-type region 111b of the first sub-cell 110b and the back electrode 102b is in contact with one of the one or more further sub-cells 120. The front electrode 101b therefore functions as a negative (electron collecting) electrode, whilst the back electrode 102b functions as a positive (hole collecting) electrode.

In FIG. 4b the illustrated multi-junction photovoltaic device 100b is a tandem device comprising two photoactive sub-cells 110b, 120, wherein the top/upper/first sub-cell 110b comprises a photosensitive/light absorbing perovskite material 113b of formula (I) and the bottom/lower/second sub-cell 120 can, for example, comprise a crystalline silicon-based sub-cell.

By way of example, in this exemplary structure the front electrode 101b may comprise a transparent conductive oxide (TCO) such as tin-doped indium-oxide (ITO), fluorine doped tin oxide (FTO) etc., the n-type region 111b may comprise one or more layers of n-type material (e.g. where each layer of n-type material may comprise an n-type material selected from those detailed above, the p-type region 112b may comprise one or more layers of p-type material (e.g. where each layer of p-type material may comprise a p-type material selected from those detailed above), and the back electrode 102b may comprise a high work function metal such as gold (Au) silver (Ag), nickel (Ni), palladium (Pd), platinum (Pt) or aluminium (Au). By way of example, the intermediate region 130 could comprise a recombination layer comprising a layer of ITO.

FIGS. 5a to 5c illustrate some further exemplary embodiments of multi-junction photovoltaic devices having a first sub-cell comprising a perovskite material of general formula (I) and one or more further sub-cells.

FIG. 5a illustrates an example of a tandem photovoltaic device, wherein the top/upper/first sub-cell comprises a photosensitive/light absorbing perovskite material and the bottom/lower/second sub-cell comprises a crystalline silicon sub-cell. In this exemplary embodiment, the crystalline silicon sub-cell comprises an amorphous silicon/crystalline silicon heterojunction (SHJ) that makes use of a crystalline silicon (c-Si) wafer as a photoactive absorber and amorphous silicon (a-Si) thin-films for junction formation and surface passivation. The crystalline silicon sub-cell comprises a p-type a-Si emitter, an intrinsic a-Si passivation/buffer layer, an n-type c-Si photoactive absorber, another intrinsic a-Si passivation/buffer layer, and a back-surface field (BSF) layer made of n-type a-Si.

FIG. 5b illustrates an example of a tandem photovoltaic device, wherein the top/upper/first sub-cell comprises a photosensitive/light absorbing perovskite material and the bottom/lower/second sub-cell comprises a CIGS, CIS, or CZTSSe sub-cell. In this exemplary embodiment, the bottom sub-cell comprises a (p-type) CIGS, CIS, or CZTSSe photoactive absorber and a (n-type) CdS buffer layer.

FIG. 5c illustrates an example of a tandem photovoltaic device, wherein the top/upper/first sub-cell comprises a photosensitive/light absorbing perovskite material and the bottom/lower/second sub-cell comprises a second photosensitive/light absorbing perovskite material.

Multi-Junction Device

Consequently, there is provided multi-junction photovoltaic device comprising a first (upper) sub-cell and a second (lower) sub-cell, wherein the first sub-cell comprises a light absorbing perovskite material having a general formula (I) of:

$$A_{1-x}A'_xBX_{3-y}X'_y \quad (I)$$

wherein A is a formamidinium cation $(HC(NH_2)_2^+)$, A' is a caesium cation $(Cs^+)$, B is at least one divalent inorganic cation, X is iodide and X' is bromide, and wherein $0<x\le 0.4$ and $0<y\le 3$. Preferably, the multi-junction photovoltaic device is a tandem photovoltaic device comprising two photoactive regions, wherein the first photoactive region is the top photoactive region and the second photoactive region is bottom the photoactive region.

The first sub-cell may comprise an n-type region comprising at least one n-type layer and a layer of the perovskite material in contact with the n-type region. The first sub-cell may comprise an n-type region comprising at least one n-type layer, a p-type region comprising at least one p-type layer; and a layer of the perovskite material disposed between the n-type region and the p-type region.

The multi-junction photovoltaic device may further comprise a first electrode, and a second electrode, wherein the first sub-cell and the second sub-cell are disposed between the first and second electrodes.

The first electrode may then be in contact with the p-type region of the first sub-cell, and wherein the first electrode comprises a transparent or semi-transparent electrically conductive material. The first electrode may then be a hole collecting electrode, whilst the second electrode is an electron collecting electrode.

Alternatively, the first electrode may be in contact with the n-type region of the first sub-cell, and wherein the first electrode comprises a transparent or semi-transparent electrically conductive material. The first electrode may then be an electron collecting electrode, whilst the second electrode is a hole collecting electrode.

The second photoactive region may comprise any of a second perovskite material, crystalline silicon, CdTe, CuZnSnSSe, CuZnSnS, or CuInGaSe (CIGS).

Preferably, the second sub-cell comprises a crystalline silicon sub-cell, and more preferably the crystalline silicon sub-cell comprises a silicon heterojunction (SHJ), and yet more preferably the crystalline silicon sub-cell comprises an amorphous silicon:crystalline silicon heterojunction.

The perovskite material may then has the formula (II):

$$FA_{1-x}Cs_xPbI_{3-y}Br_y \quad (II)$$

wherein FA is a formamidinium cation $((HC(NH_2)_2^+))$, Cs is a caesium cation (Cs+), Pb is a lead (II) cation $(Pb^{2+})$, I is iodide $(I^-)$ and Br is bromide $(Br^-)$. Preferably, x is then equal to or greater than 0.05 and less than or equal to 0.25, and is more preferably equal to any of 0.05, 0.10, 0.15, 0.20, and 0.25. Preferably, y is then greater than 0 and less than 1.5, is more preferably greater than 0 and less than or equal to 1.0, and is yet more preferably 0.6.

The multi-junction photovoltaic device may have a monolithically integrated structure. The multi-junction photovoltaic device may then further comprise an intermediate region connecting the first sub-cell to the second sub-cell, wherein the intermediate region comprises one or more interconnect layers.

Perovskite Material

As noted above, in the photovoltaic devices of the present invention, the photoactive region comprises a perovskite material of general formula (I):

$$A_{1-x}A'_xBX_{3-y}X'_y \quad (I)$$

wherein A is a formamidinium cation $(HC(NH_2)_2^+)$, A' is a caesium cation $(Cs^+)$, B is at least one divalent inorganic cation, X is iodide and X' is bromide, with the value of x being greater than 0 and less than or equal to 0.4 and the value of y being greater than 0 and less than or equal to 3.

The band gap of the perovskite material of formula (I) is therefore tuneable between 1.60 eV to 2.30 eV, which makes it particularly suitable for use in the top sub-cell of a multi-junction photovoltaic device when combined with one or more further sub-cells. The one or more further sub-cells may comprise any of a second photoactive perovskite material, crystalline silicon, CdTe, CuZnSnSSe, CuZnSnS, or CuInGaSe (CIGS). Preferably the band gap of the perovskite material is from 1.65 eV to 1.75 eV as the perovskite material is then ideal for use in a top sub-cell of a tandem photovoltaic device wherein the bottom sub-cell preferably has band gap of around 1.1 eV. In particular, when the band gap of the perovskite material is around 1.65 eV to 1.75 eV, the perovskite material is then ideal for use in a top sub-cell of a tandem photovoltaic device wherein the bottom sub-cell comprises crystalline silicon.

The at least one divalent inorganic cation (B) is then preferably any divalent metal cation. For example, the at least one divalent inorganic cation (B) may be selected from $Pb^{2+}$ and $Sn^{2+}$, and is preferably a lead (II) cation ($Pb^{2+}$).

As detailed above, in the perovskite material of formula (I) the value of x is greater than 0 and less than 1. The value of x is typically greater than 0 and less than or equal to 0.80, is preferably greater than 0 and less than or equal to 0.55, and is more preferably greater than 0 and less than or equal to 0.40. For example, the value x may be approximately 0.25, 0.5 or 0.75, and is preferably equal to any of 0.05, 0.10, 0.15, 0.20, and 0.25.

As detailed above, in the perovskite material of formula (I) the value of y is greater than 0 and less than or equal to 3. The value of y is typically greater than 0 and less than 1.5, is preferably greater than 0 and less than or equal to 1.0, and is preferably greater than or equal to 0.25 and less than or equal to 1.0. For example, the value x may be approximately 0.3, 0.6, 1 or 1.5, and is preferably 0.6.

In a preferred embodiment, the perovskite material has the formula:

$$FA_{1-x}Cs_xPbI_{3-y}Br_y \quad (II)$$

wherein FA is a formamidinium cation ($(HC(NH_2)_2^+)$), Cs is a caesium cation ($Cs^+$), Pb is a lead cation ($Pb^{2+}$), I is iodide ($I^-$) and Br is bromide ($Br^-$). The value of x is greater than 0 and less than or equal to 0.40 and the value of y may be greater than 0 and less than or equal to 3. Preferably, y is greater than 0 and is less than 1.5, more preferably y is greater than 0 and is less than or equal to 1.0, and is yet more preferably greater than 0 and less than or equal to 0.6.

Method of Producing a Photovoltaic Device

There is also provided a method of producing a photovoltaic device comprising a photoactive material, which photoactive material comprises a perovskite of general formula (I). The method comprises a step (a) of disposing a second region on a first region, which second region comprises a layer of the photoactive material. For example, the first region may be an n-type region comprising at least one n-type layer.

The method may further comprise a step (b) of disposing a third region on the second region. The first region may be an n-type region comprising at least one n-type layer and the third region may then be a p-type region comprising at least one p-type layer. Alternatively, the first region may be a p-type region comprising at least one p-type layer and the third region may then be an n-type region comprising at least one n-type layer.

The step (a) of disposing a second region on the first region typically comprise producing a solid layer of the perovskite material by chemical solution deposition. Typically, the step of producing a solid layer of the perovskite material by chemical solution deposition comprises either a one-step or a two-step deposition process.

In the one-step process, the step of producing a solid layer of the perovskite material comprises:
  (i) forming a precursor solution comprising precursors of the perovskite material dissolved in a solvent system;
  (ii) disposing/depositing a layer of the precursor solution; and
  (iii) removing the solvent system to produce a solid layer of the perovskite material.

Optionally, the step (a) of disposing a second region on the first region further comprises, subsequent to the step of in which a solid layer of the perovskite material is produced, a step of curing the solid layer of the perovskite material. The step of curing the solid layer of the perovskite material would typically involve heating the solid layer of the perovskite material to an elevated temperature for a set period of time, wherein the temperature and time period used for the curing step depends upon the specific composition of the perovskite material. In this regard, the skilled person would readily be able to determine an appropriate temperature and time period for the curing a solid layer of a perovskite material by using well-known procedures which do not require undue experimentation. In particular, it is noted that the skilled person will be aware that the exact temperature and time period used for the curing step will depend on variations in the equipment and apparatus used to perform the curing step, such that the selection of the values for these parameters is a matter of routine for the skilled person.

In the one-step process, the precursors of the perovskite material typically comprise:
  a first precursor compound comprising the formamidinium cation ($(HC(NH_2)_2^+)$)(A) and a first halide anion;
  a second precursor compound comprising the caesium cation ($Cs^+$)(A) and either the first halide anion or a second halide anion; and a third precursor compound comprising the divalent inorganic cation (B) and the second halide anion;
wherein the first halide anion is one of iodide (X) and bromide (X') and the second halide is the other of iodide (X) and iodide (X)).

Preferably, the precursors of the perovskite material further comprise a fourth precursor compound comprising the divalent inorganic cation (B) and the first halide anion. More preferably, the first precursor compound comprises the formamidinium cation ($(HC(NH_2)_2^+)$) (A) and a first halide anion, the second precursor compound comprises the caesium cation ($Cs^+$) (A') and the first halide anion, the third precursor compound comprises the divalent metal inorganic cation (B) and the second halide anion, and the fourth precursor compound comprises the divalent metal inorganic cation (B) and the first halide anion.

By way of example, the precursors of the perovskite material may comprise a first precursor compound comprising the formamidinium cation ($(HC(NH_2)_2^+)$) (A) and iodide (X), a second precursor compound comprising the caesium cation ($Cs^+$) (A') and the iodide (X), a third precursor compound comprising the divalent metal cation (B) and iodide (X), and a fourth precursor compound comprising the divalent metal cation (B) and bromide (X'). Expanding upon this example, the first precursor compound may have the formula AX, the second precursor compound may have the formula A'X, the third precursor compound may have the formula $BX_2$, and the fourth precursor compound may have the formula $BX'_2$.

By way of further example, the precursors of the perovskite material may comprise a first precursor compound comprising the formamidinium cation ($(HC(NH_2)_2^+)$) (A) and bromide (X'), a second precursor compound comprising the caesium cation ($Cs^+$) (A') and the bromide (X'), a third precursor compound comprising the divalent inorganic cation (B) and bromide (X'), and a fourth precursor compound comprising the divalent inorganic cation (B) and iodide (X). Expanding upon this example, the first precursor compound may have the formula AX', the second precursor compound may have the formula A'X', the third precursor compound may have the formula $BX'_2$, and the fourth precursor compound may have the formula $BX_2$.

In this one-step process, the solvent system in which the precursors of the perovskite material are dissolved typically comprises one or more solvents selected from dimethyl sulfoxide (DMSO), N,N-dimethylformamide (DMF), N-cyclohexyl-2-pyrrolidone (CHP), and dimethylacetamide (DMAc). Preferably, the solvent system comprises any of DMF, DMSO, DMF, a mixture of DMF and CHP, and DMAc. Preferably, the solvent system consists of DMAc.

In this one-step process, the ratio by amount of each of the precursor compounds used in the precursor solution depends upon the fraction/proportion of each of the ions (given by the values of x and y) present in the specific composition of the perovskite material. The skilled person would therefore readily be able to determine appropriate amounts of each of the precursor compounds for a perovskite material of a specific composition.

In the one-step process, the precursors of the perovskite material may alternatively comprise:
- a first precursor compound comprising the formamidinium cation ($(HC(NH_2)_2^+)$) (A) and a first halide anion;
- a second precursor compound comprising the formamidinium cation ($(HC(NH_2)_2^+)$) (A) and a sacrificial organic anion (Y);
- a third precursor compound comprising the caesium cation ($Cs^+$) (A') and either the first halide anion or a second halide anion; and
- a fourth precursor compound comprising the divalent inorganic cation (B) and a second halide anion;

wherein the first halide anion is one of iodide (X) and bromide (X') and the second halide is the other of iodide (X) and iodide (X)).

Preferably, the precursors of the perovskite material further comprise a fifth precursor compound comprising the divalent inorganic cation (B) and the first halide anion. More preferably, the first precursor compound comprises the formamidinium cation ($(HC(NH_2)_2^+)$) (A) and a first halide anion, the second precursor compound comprises the formamidinium cation ($(HC(NH_2)_2^+)$) (A) and a sacrificial organic anion (Y), the third precursor compound comprises the caesium cation ($Cs^+$) (A') and the first halide anion, the fourth precursor compound comprises the divalent inorganic cation (B) and the second halide anion, and the fifth precursor compound comprises the divalent inorganic cation (B) and the first halide anion.

In this process, the sacrificial organic anion (Y) forms a volatile compound (AY) with the formamidinium cation ($(HC(NH_2)_2^+)$) (A). As discussed herein, volatile compounds are those compounds which are removed easily by evaporation, whether by evaporation of the compound itself or by evaporation of decomposition products from the compound. Without wishing to be bound by theory, it is believed that the presence of this volatile compound (AY) during the reaction slows the crystallisation of the perovskite material and thereby improves the crystal structure of the resulting perovskite material.

The process may further comprise enabling the removal of a volatile compound comprising the sacrificial organic anion (Y) and the formamidinium cation ($(HC(NH_2)_2^+)$) (A) from the deposited layer of the precursor solution. The step of enabling the removal of the volatile compound (AY) may comprise allowing the volatile compound to evaporate, decompose, or evaporate and decompose. Thus, the step of enabling the volatile compound to be removed may comprise heating the deposited layer of the precursor solution or exposing the deposited layer of the precursor solution. Often, the substrate and/or solution is heated to remove the volatile compound.

Typically, the volatile compound (AY) is more volatile than a compound which consists of the formamidinium cation ($(HC(NH_2)_2^+)$) (A) and the first halide anion and/or a compound which consists of the caesium cation ($Cs^+$) (A') together with the first halide anion and/or the second halide anion (i.e. the first precursor compound and the third precursor compound). Whether one compound is more volatile than another is easily measured. For instance, thermogravimetric analysis may be performed and the compound which loses certain mass (for instance 5% mass) at the lower temperature is the more volatile. Often, the temperature at which the volatile compound (comprising the sacrificial organic anion (Y) and the formamidinium cation (($HC(NH_2)_2^+$)) (A)) has lost 5% mass (following heating from room temperature, e.g. 20° C.) is more than 25° C. less than the temperature at which a compound which consists of the formamidinium cation ($(HC(NH_2)_2^+)$) (A) and the first halide anion and/or a compound which consists of the caesium cation ($Cs^+$) (A') together with the first halide anion and/or the second halide anion have lost 5% mass (following heating from room temperature, e.g. 20° C.). For instance, if a compound which consists of the formamidinium cation ($(HC(NH_2)_2^+)$) (A) and the first halide anion has lost 5% mass at a temperature of 200° C., the volatile compound has typically lost 5% mass at a temperature of 175° C. or lower.

The sacrificial organic anion (Y) may be an organic anion of formula $RCOO^-$, $ROCOO^-$, $RSO_3^-$, $ROP(O)(OH)O^-$ or $RO^-$, wherein R is H, substituted or unsubstituted $C_{1-10}$ alkyl, substituted or unsubstituted $C_{2-10}$ alkenyl, substituted or unsubstituted $C_{2-10}$ alkynyl, substituted or unsubstituted $C_{3-10}$ cycloalkyl, substituted or unsubstituted $C_{3-10}$ heterocyclyl or substituted or unsubstituted aryl. In particular, the sacrificial anion may be formate ($HCOO^-$), acetate ($CH_3COO^-$), propanoate ($C_2H_5COO^-$), butanoate ($C_3H_7COO^-$), pentanoate ($C_4H_{10}COO^-$), or benzoate ($C_6H_5COO^-$).

The second precursor compound may therefore comprise a compound of formula AY, wherein A is the formamidinium cation (($HC(NH_2)_2^+$)) and Y is the sacrificial organic anion. Preferably the second precursor compound is formamidinium ($HC(NH_2)_2^+$) acetate, formamidinium ($HC(NH_2)_2^+$) formate, or formamidinium ($HC(NH_2)_2^+$) propanoate.

In this one-step process, the solvent system in which the precursors of the perovskite material are dissolved typically comprises one or more solvents selected from dimethyl sulfoxide (DMSO), N, N-dimethylformamide (DMF), N-cyclohexyl-2-pyrrolidone (CHP), and dimethylacetamide (DMAc). Preferably, the solvent system comprises any of DMF, DMSO, DMF, a mixture of DMF and CHP, and DMAc. Preferably, the solvent system consists of DMF.

The precursor solution is typically disposed by solution processing. For example, a composition comprising the precursor compounds and a solvent system may be disposed on the substrate, for instance by spin-coating, or for instance by graveur coating, slot dye coating, screen printing, ink jet printing, doctor blade coating, or spray coating.

In the two-step process, the step of producing a solid layer of the perovskite material comprises:
(i) forming a first precursor solution comprising precursors of the perovskite material dissolved in a first solvent system;
(ii) disposing/depositing a layer of the first precursor solution;
(iii) removing the first solvent system to form a solid layer of the one or more precursors;
(iii) forming a second precursor solution comprising further precursors of the perovskite material dissolved in a second solvent system; and
(iv) treating the solid layer of the one or more precursors with the second precursor solution and thereby reacting the one or more precursors and the one or more further precursors to produce a solid layer of the perovskite material.

Optionally, the step (iv) of treating the solid layer of the one or more precursors with the second precursor solution comprises depositing the second precursor solution on the solid layer of the one or more precursors, and heating the second precursor solution on the solid layer of the one or more precursors to produce a solid layer of the perovskite material. The step of heating the second precursor solution on the solid layer of the one or more precursors would typically involve heating to an elevated temperature for a set period of time, wherein the temperature and time period used for the heating step depends upon the specific composition of the perovskite material. In this regard, the skilled person would readily be able to determine an appropriate temperature and time period for the heating step by using well-known procedures which do not require undue experimentation. In particular, it is noted that the skilled person will be aware that the exact temperature and time period used for the heating step will depend on variations in the equipment and apparatus used to perform the heating step, such that the selection of the values for these parameters is a matter of routine for the skilled person.

In the two-step process, the precursors of the perovskite material in the first precursor solution typically comprise:
a first precursor compound comprising the divalent inorganic cation (B) and a first halide anion.

The further precursors of the perovskite material in the second precursor solution then comprise:
a second precursor compound comprising the formamidinium cation (($HC(NH_2)_2^+$)) (A) and either the first halide anion or a second halide anion, and
a third precursor compound comprising the caesium cation ($Cs^+$) (A') and either the first halide anion or the second halide anion;
wherein the first halide anion is one of iodide (X) and bromide (X') and the second halide is the other of iodide (X) and bromide (X').

By way of example, the precursors of the perovskite material in the first precursor solution may comprise a first precursor compound comprising the divalent inorganic cation (B) and iodide (X). The further precursors of the perovskite material in the second precursor solution may then comprise a second precursor compound comprising the formamidinium cation (($HC(NH_2)_2^+$)) (A) and iodide (X) or bromide (X'), and a third precursor compound comprising the caesium cation ($Cs^+$) (A') iodide (X) or bromide (X'). Expanding upon this example, the first precursor compound may have the formula $BX_2$, the second precursor compound may have the formula AX or AX', and the third precursor compound may have the formula A'X' or A'X'. Preferably, if the second precursor compound is of the formula AX then the third precursor compound is of the formula A'X', and if the second precursor compound is of the formula AX' then the third precursor compound is of the formula A'X.

By way of further example, the precursors of the perovskite material in the first precursor solution may comprise a first precursor compound comprising the divalent inorganic cation (B) and bromide (X'). The further precursors of the perovskite material in the second precursor solution may then comprise a second precursor compound comprising the formamidinium cation (($HC(NH_2)_2^+$)) (A) and iodide (X) or bromide (X'), and a third precursor compound comprising the caesium cation ($Cs^+$) (A') and iodide (X) or bromide (X'). Expanding upon this example, the first precursor compound may have the formula $BX'_2$, the second precursor compound may have the formula AX or AX', and the third precursor compound may have the formula A'X or A'X'. Preferably, if the second precursor compound is of the formula AX then the third precursor compound is of the formula A'X', and if the second precursor compound is of the formula AX' then the third precursor compound is of the formula A'X.

In the two-step process, the first solvent system may comprise one or more solvents selected from dimethyl sulfoxide (DMSO), N,N-dimethylformamide (DMF), N-cyclohexyl-2-pyrrolidone (CHP), and dimethylacetamide (DMAc). Preferably, the first solvent system comprise any of DMF, DMSO, DMF, a mixture of DMF and CHP, and DMAc. The second solvent system then comprises one or more solvents that are capable of dissolving the one or more further precursors and that are orthogonal to the one or more solvents of the first solvent system.

Furthermore, when the photovoltaic device has a multi-junction structure, such that the photovoltaic device comprises a first sub-cell and one or more further sub-cells, the method then further comprises providing a further sub-cell, disposing an intermediate region on the further sub-cell, and forming the first sub-cell on the intermediate region. The step of forming the first sub-cell on the intermediate region then comprises step (a) or steps (a) and (b) outlined above.

Formulation for Use in the Formation of the Perovskite Material

Furthermore, there is also provided a formulation for use in the formation of a photosensitive/light absorbing a perovskite material of general formula (I). The formulation comprises precursor compounds of the perovskite material.

In one embodiment, the precursors of the perovskite material in the formulation comprise a first precursor compound comprising the formamidinium cation (($HC(NH_2)_2^+$)) (A) and a first halide anion, a second precursor compound comprising the caesium cation ($Cs^+$) (A') and either the first halide anion or a second halide anion, and a third precursor compound comprising the divalent inorganic cation (B) and the second halide anion, wherein the first halide anion is one of iodide (X) and bromide (X') and the second halide is the other of iodide (X) and iodide (X)).

Preferably, the precursors of the perovskite material in the formulation further comprise a fourth precursor compound comprising the divalent inorganic cation (B) and the first halide anion. More preferably, the first precursor compound comprises the formamidinium cation (($HC(NH_2)_2^+$)) (A) and a first halide anion, the second precursor compound comprises the caesium cation ($Cs^+$) (A') and the first halide anion, the third precursor compound comprises the divalent metal inorganic cation (B) and the second halide anion, and the fourth precursor compound comprises the divalent metal inorganic cation (B) and the first halide anion.

The at least one divalent inorganic cation (B) can be any divalent metal cation. Preferably, the at least one divalent inorganic cation (B) is selected from $Pb^{2+}$ and $Sn^{2+}$, and is more preferably a lead (II) cation ($Pb^{2+}$).

In a preferred embodiment, the formulation comprises a first precursor compound comprising a formamidinium cation (($HC(NH_2)^{2+}$)) and a first halide anion, a second precursor compound comprising a caesium cation ($Cs^+$) and the first halide anion, a third precursor compound comprising a lead (II) cation ($Pb^{2+}$) and the first halide anion, and a fourth precursor compound comprising a lead (II) cation ($Pb^{2+}$) and a second halide anion, wherein the first halide anion is one of iodide (X) and bromide (X') and the second halide is the other of iodide (X) and iodide (X)).

In an alternative embodiment, the precursors of the perovskite material in the formulation comprise a first precursor compound comprising the formamidinium cation (($HC(NH_2)_2^+$)) (A) and a first halide anion, a second precursor compound comprising the formamidinium cation (($HC(NH_2)_2^+$)) (A) and a sacrificial organic anion (Y), a third precursor compound comprising the caesium cation ($Cs^+$) (A') and either the first halide anion or a second halide anion, and a fourth precursor compound comprising the divalent inorganic cation (B) and a second halide anion, wherein the first halide anion is one of iodide (X) and bromide (X') and the second halide is the other of iodide (X) and iodide (X)).

Preferably, the precursors of the perovskite material in the formulation further comprise a fifth precursor compound comprising the divalent inorganic cation (B) and the first halide anion. More preferably, the first precursor compound comprises the formamidinium cation (($HC(NH_2)_2^+$)) (A) and a first halide anion, the second precursor compound comprises the formamidinium cation (($HC(NH_2)_2^+$)) (A) and a sacrificial organic anion (Y), the third precursor compound comprises the caesium cation ($Cs^+$) (A') and the first halide anion, the fourth precursor compound comprises the divalent inorganic cation (B) and the second halide anion, and the fifth precursor compound comprises the divalent inorganic cation (B) and the first halide anion.

The sacrificial organic anion (Y) may be an organic anion of formula $RCOO^-$, $ROCOO^-$, $RSO_3^-$, $ROP(O)(OH)O^-$ or $RO^-$, wherein R is H, substituted or unsubstituted $C_{1-10}$ alkyl, substituted or unsubstituted $C_{2-10}$ alkenyl, substituted or unsubstituted $C_{2-10}$ alkynyl, substituted or unsubstituted $C_{3-10}$ cycloalkyl, substituted or unsubstituted $C_{3-10}$ heterocyclyl or substituted or unsubstituted aryl. In particular, the sacrificial anion may be formate ($HCOO^-$), acetate ($CH_3COO^-$), propanoate ($C_2H_5COO^-$), butanoate ($C_3H_7COO^-$), pentanoate ($C_4H_{10}COO^-$), or benzoate ($C_6H_5COO^-$).

Preferably the second precursor compound is formamidinium ($HC(NH_2)_2^+$) acetate, formamidinium ($HC(NH_2)_2^+$) formate, or formamidinium ($HC(NH_2)_2^+$) propanoate.

Moreover, a precursor solution for use in the formation of a photosensitive/light absorbing a perovskite material of general formula (I) can be provided by dissolving the precursor compounds of the above described formulations in a suitable solvent system. The precursor solution therefore comprises a solution of the cations and anions that comprise each of the precursor compounds.

In one embodiment, the precursor solution therefore comprises a solution of a formamidinium cation (($HC(NH_2)_2^+$)) A, a caesium cation ($Cs^+$)A', at least one divalent metal cation B, iodide X and bromide X'. Preferably the ratio of the ions A:A':B:X:X' in the precursor solution are 1-x:x:1:3-y:y wherein $0<x\leq0.4$ and $0<y\leq3$.

In an alternative embodiment, therefore comprises a solution of a formamidinium cation (($HC(NH_2)_2^+$))A, a caesium cation ($Cs^+$)A', at least one divalent metal cation B, iodide X, bromide X', and a sacrificial organic anion (Y). Preferably the ratio of the ions A:A':B:X:X' in the precursor solution are 1-x:x:1:3-y:y wherein $0<x\leq0.4$ and $0<y\leq3$.

Typically, the solvent system in which the precursors of the perovskite material are dissolved comprises one or more solvents selected from dimethyl sulfoxide (DMSO), N,N-dimethylformamide (DMF), N-cyclohexyl-2-pyrrolidone (CHP), and dimethylacetamide (DMAc). Preferably, the solvent system comprises any of DMF, DMSO, a mixture of DMF and CHP, and DMAc. When the precursors of the perovskite material do not include a sacrificial organic anion the solvent system preferably consists of DMAc. Alternatively, when the precursors of the perovskite material do include a sacrificial organic anion the solvent system preferably consists of DMF.

The perovskite material of general formula (I) can therefore be obtained by dissolving the precursor compounds of the above described formulation in a suitable solvent system, and thereby forming the above described precursor solution, depositing the precursor solution onto a suitable substrate, and subjecting the substrate to a temperature and pressure regime that facilitates removal of the one or more solvents that comprise the solvent system. Where the precursor compounds include a compound comprising a sacrificial organic anion (Y), the substrate should be subjected to a temperature and pressure regime that also facilitates removal of a volatile compound comprising the sacrificial organic anion (Y) and the formamidinium cation (($HC(NH_2)_2^+$)) (A).

Examples

In the exemplary embodiments detailed below, perovskite materials were formed as films by spin coating deposition from a solution. In these embodiments, solid precursors for the perovskite materials were weighed and mixed together in a vial. This mixture was then loaded into a glovebox where the solvent was added for a final solution having 38 wt % of perovskite precursors.

For the dissolution of the solids the mixture was heated under continuous stirring at 100° C., forming a solution that was yellow and transparent. Once all the solids were in solution, the solution was removed from the hotplate and left to cool down to room temperature. The final solution was then filtered prior to deposition.

The solution was spin coated onto a substrates (i.e. glass, FTO or ITO) inside the glovebox with spin speeds ranging between 3000-4000 rpm, depending on the desired final film thickness, for 60 seconds. In these exemplary embodiments the resulting perovskite films had thicknesses of between 350 nm and 500 nm. Whilst lower speeds could be used, this would result in thicker films.

Immediately after the deposition the film was moved to a hot plate set up at the desired temperature, where the curing temperature depends on the curing time required. For these particular embodiments, the temperature can be varied from 130 to 150° C. with curing times of between 10-30 minutes. No obvious changes in the final film have been observed by varying the curing parameters in that range.

The resulting perovskite thin films were then characterised by X-ray diffraction (XRD) and scanning electron microscopy (SEM) to confirm the formation of the perovskite and the formation of a continuous film that is suitable for incorporation into photovoltaic devices.

Figures 6A, 6B:
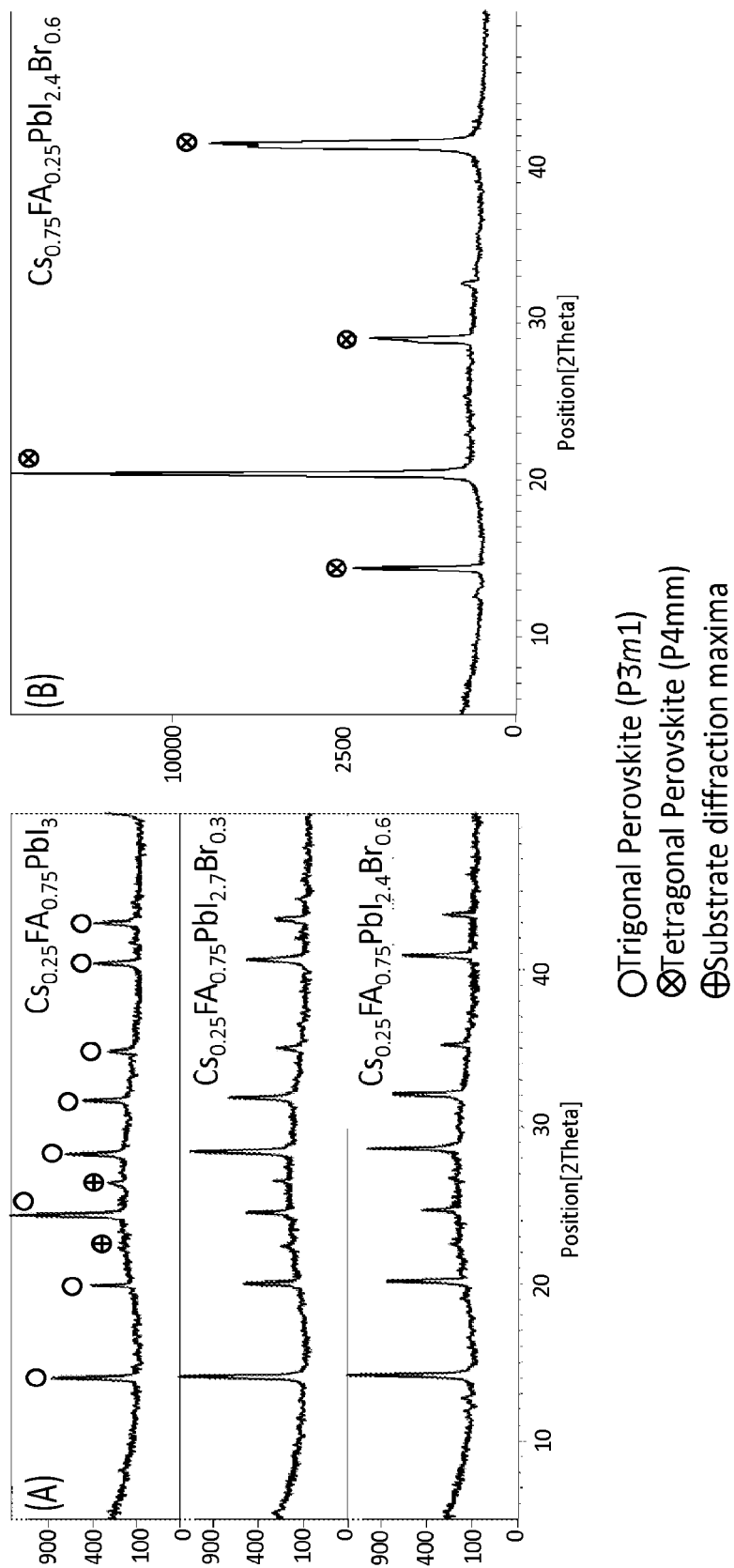
FIGS. 6A-6B show the XRD pattern of four different perovskite materials.

FIGS. 6A-6B show the XRD pattern of four different perovskite materials. FIG. 6A shows the XRD diffraction pattern of three different perovskite materials of general formula $FA_{1-x}Cs_xPbI_{3-y}Br_y$, with x=0.25 and y=0, 0.3, and 0.6 respectively, each produced using the method described above. The FA:Cs ratio was therefore constant between each of the materials, but from top to bottom there is a decrease in the I:Br ratio, with the top perovskite material including no Br for the purpose of comparison with perovskite materials described herein. FIG. 6B then shows the XRD diffraction pattern of a perovskite material of general formula $MA_{1-x}Cs_xPbI_{3-y}Br_y$, with x=0.75 and y=0.6, produced using the method described above. The peaks in each of the XRD diffraction patterns of FIGS. 6A-B illustrate that the resulting materials had the expected crystal structures of the intended perovskite materials.

Figures 7A, 7B:
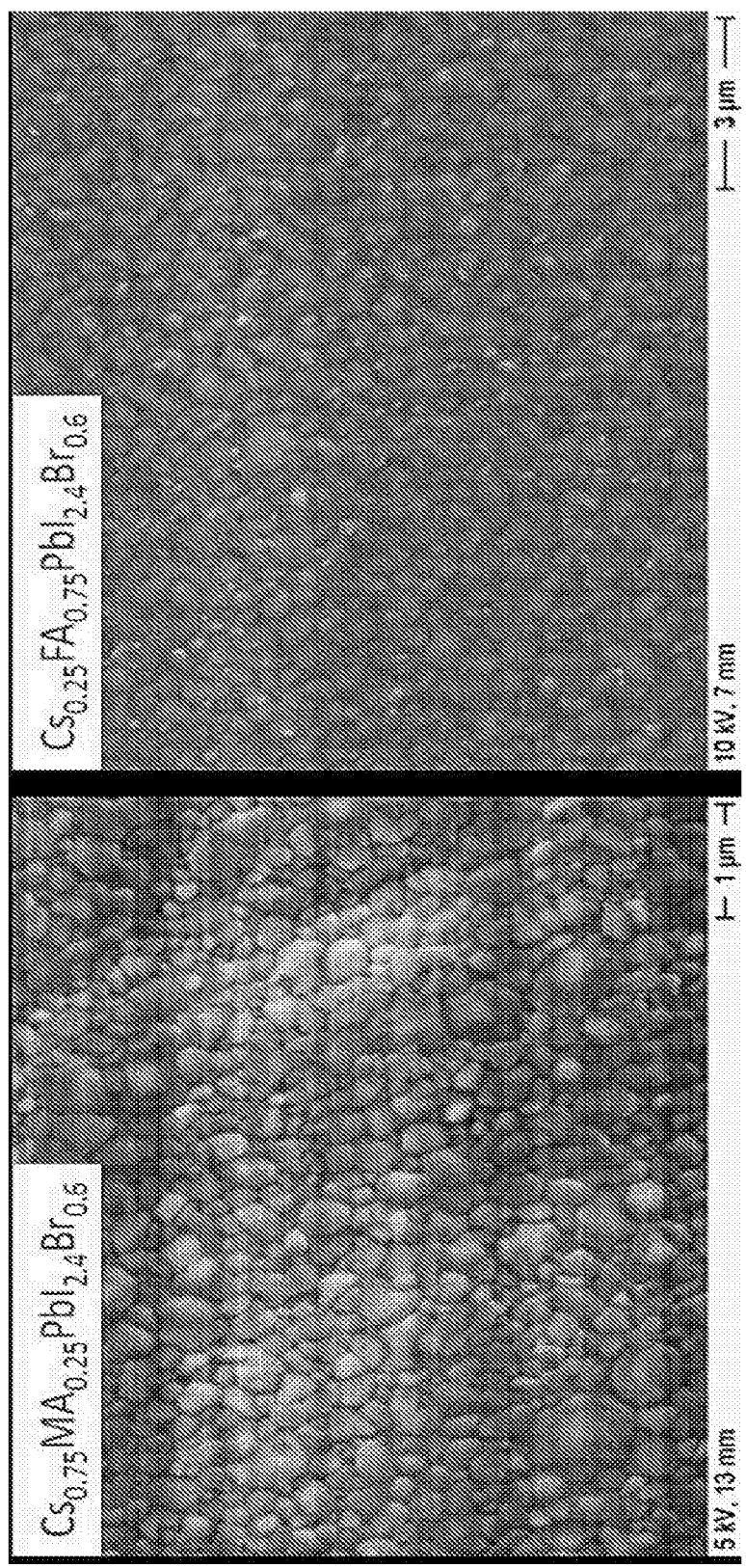
FIG. 7a shows an SEM image of a perovskite material of general formula $MA_{1-x}Cs_xPbI_{3-y}Br_y$.
FIG. 7b shows an SEM image of a perovskite material of general formula $FA_{1-x}Cs_xPbI_{3-y}Br_y$.

FIG. 7a then shows an SEM image of a perovskite material of general formula $MA_{1-x}Cs_xPbI_{3-y}Br_y$, with x=0.75 and y=0.6, whilst FIG. 7b then shows an SEM image of a perovskite material of general formula $FA_{1-x}Cs_xPbI_{3-y}Br_y$, with x=0.25 and y=0.6, both produced using the method described above. The images of FIGS. 7a and 7b show that the films of perovskite material produced using the method described above are continuous and homogenous.

Figure 8:
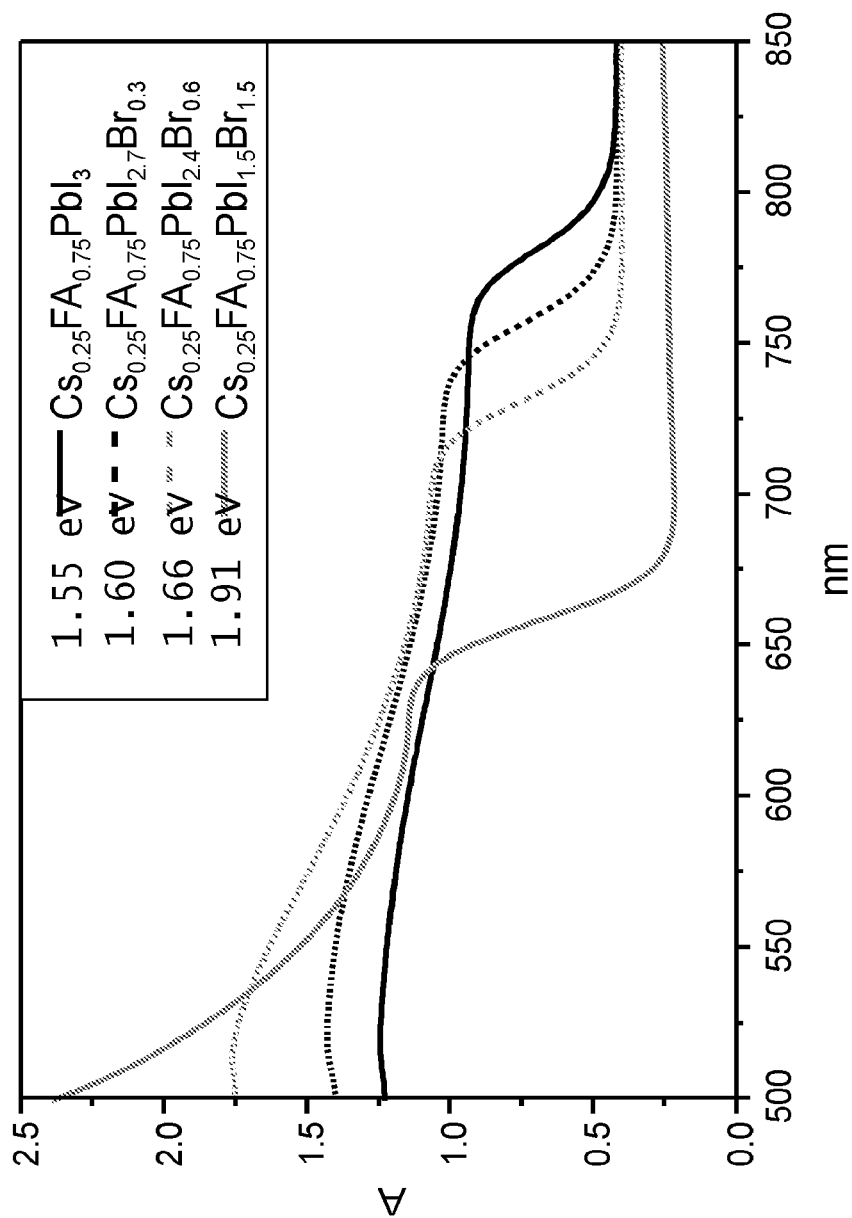
FIG. 8 shows the UV-Vis absorbance spectra of four different perovskite materials of general formula $FA_{1-x}Cs_xPbI_{3-y}Br_y$.
Figure 10:
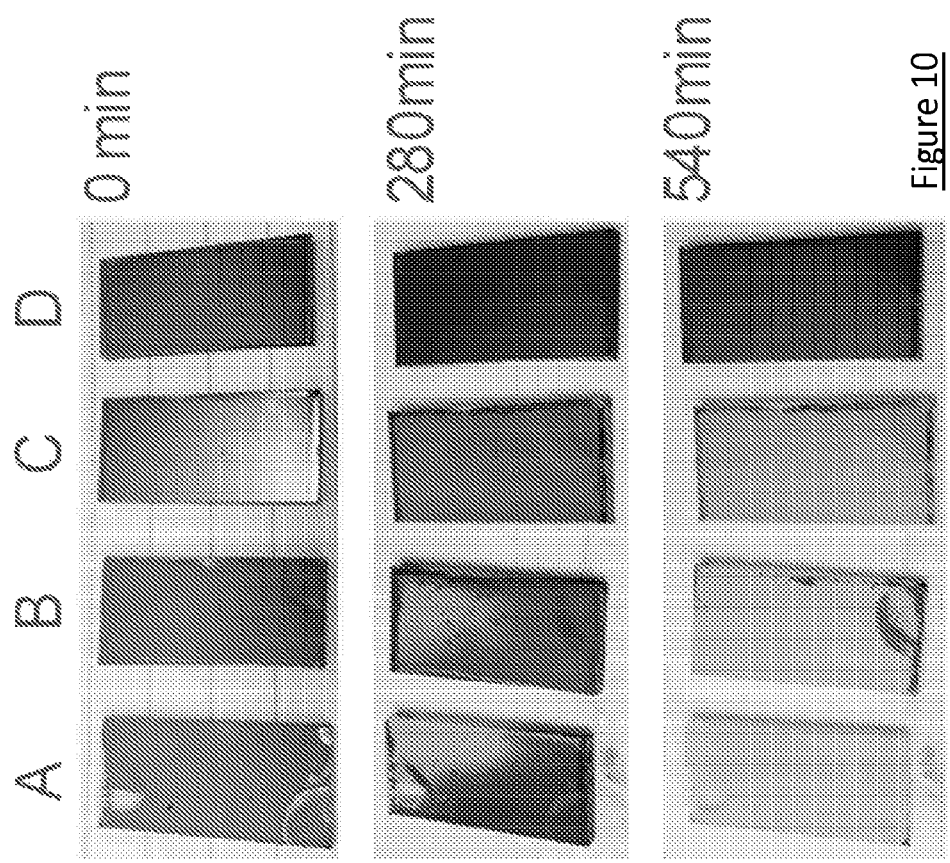
FIG. 10 shows photographs of four perovskite materials of different compositions (A to D) before, during and after thermal stability testing.

FIG. 8 shows the UV-Vis absorbance spectra of four different perovskite materials of general formula $FA_{1-x}Cs_xPbI_{3-y}Br_y$, with x=0.25 and y=0, 0.3, 0.6, and 1.5 respectively, each produced using the method described above. The FA:Cs ratio was therefore constant between each of the materials, but there is a decrease in the I:Br ratio, with one of the perovskite materials including no Br for the purpose of comparison with perovskite materials described herein. On the graph wavelength in nm is plotted on the x-axis and the absorbance in arbitrary units is plotted on the y-axis. From the absorbance spectra the optical bandgap (Eg) of each of the perovskite materials has been estimated as approximately 1.55 eV for y=0, approximately 1.60 eV for y=0.3, approximately 1.66 eV for y=0.6, and approximately 1.91 eV for y=1.5.

FIGS. 9a and 9b show the UV-Vis absorbance spectra of five different perovskite materials of general formula $MA_{1-x}Cs_xPbI_{3-y}Br_y$, each produced using the method described above.

FIG. 9a shows the UV-Vis absorbance spectra of three different perovskite materials of general formula $MA_{1-x}Cs_xPbI_{3-y}Br_y$, with x=0.5 and y=0.3, 0.6, and 1.5 respectively. FIG. 9b then shows the UV-Vis absorbance spectra of two further perovskite materials of general formula $MA_{1-x}Cs_xPbI_{3-y}Br_y$, with x=0.75 and y=0.6, and 1.5 respectively. On the graphs wavelength in nm is plotted on the x-axis and the absorbance in arbitrary units is plotted on the y-axis. From the absorbance spectra the optical bandgap (Eg) of each of the perovskite materials has been estimated as approximately 1.68 eV for x=0.5 and y=0.3, approximately 1.80 eV for x=0.5 and y=0.6, approximately 1.85 eV for x=0.5 and y=1.5, approximately 1.77 eV for x=0.75 and y=0.6, and approximately 1.96 eV for x=0.75 and y=1.5.

To compare conventional perovskite materials with perovskite materials according to the invention, the following perovskite materials were fabricated on a glass substrate: perovskite material A having formula $MAPbI_3$, perovskite material B having formula $MA_{0.5}FA_{0.5}PbI_3$ perovskite material C having formula $MA_{0.25}Cs_{0.75}PbI_{2.4}Br_{0.6}$, and perovskite material D having formula $FA_{0.75}Cs_{0.25}PbI_{2.4}Br_{0.6}$. These devices were then placed on a hot plate for 540 minutes at 150° C. in an ambient atmosphere (with 40% relative humidity) to test the thermal stability of the perovskite materials. FIG. 8 shows photographs of each of the various perovskite materials (A to D) before, during and after thermal stability testing.

As expected, the perovskite materials were all initially black in colour. As can be seen in FIG. 8, visually the films of perovskite material A and perovskite material B show some discolouration (yellowing in the top right hand corner) after 280 minutes, whilst perovskite material C and perovskite material D show no visible discolouration. Within the 540 minutes perovskite material A and perovskite material B have significantly degraded, with a substantial colour change from black to yellow (where the yellow indicates the formation of $PbI_2$), whereas the film of perovskite material C shows limited degradation, changing in colour from black to brown, whilst perovskite material D does not show any signs of degradation.

Further Examples

In the exemplary embodiments detailed below, perovskite materials were formed as films by spin coating deposition from a solution. In these embodiments, solid precursors for the perovskite materials were weighed and mixed together in a vial. This mixture was then loaded into a glovebox where the solvent was added for a final solution having 37 wt % of perovskite precursors. Immediately after the deposition the film was moved to a hot plate set up at the desired temperature, where the curing temperature depends on the curing time required. For these particular embodiments, the temperature was approximately 150° C. for a curing time of around 10 minutes.

The resulting perovskite thin films were then characterised by X-ray diffraction (XRD) to confirm the formation of the perovskite.

Figure 11:
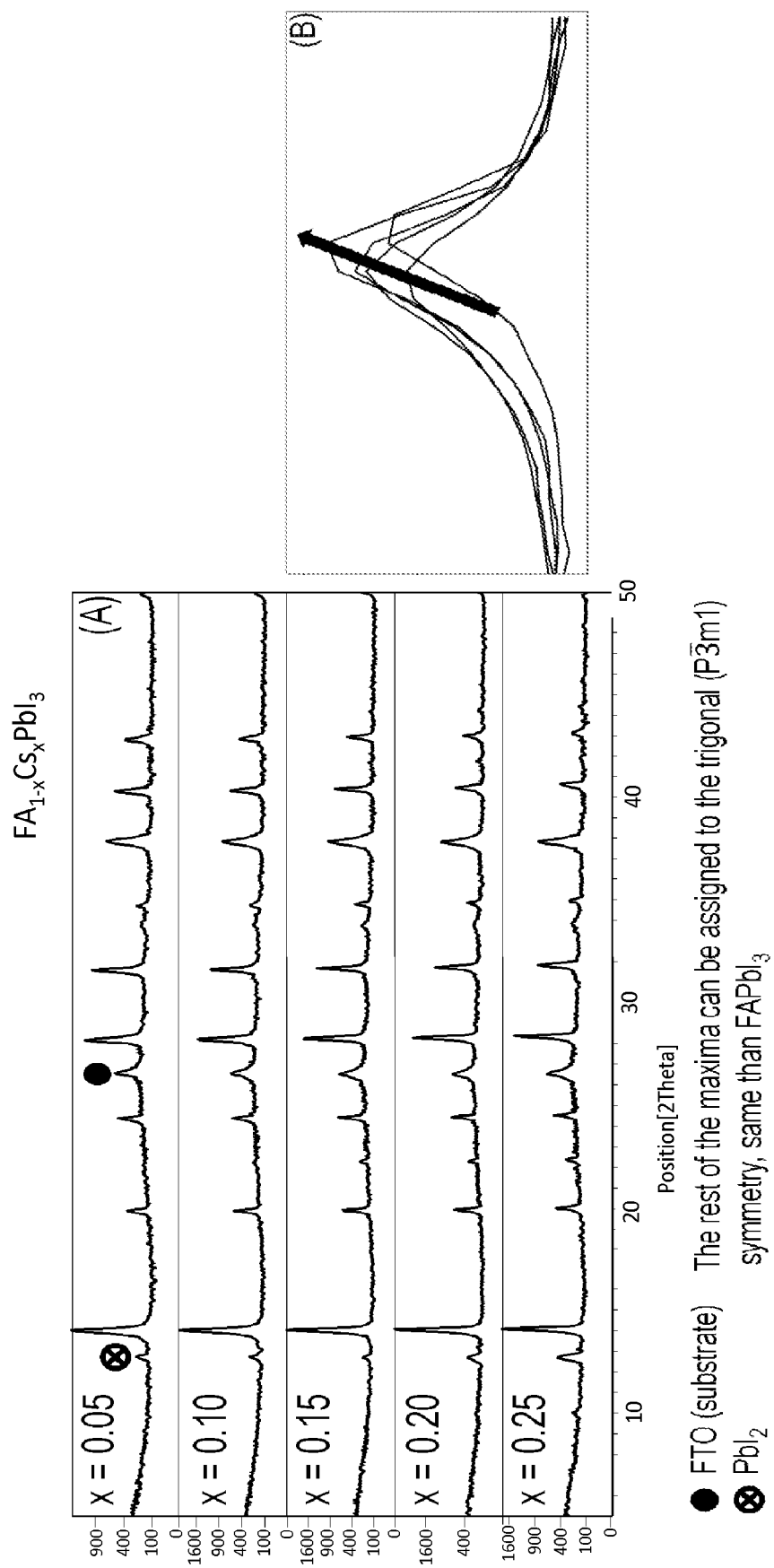
FIG. 11 shows the XRD pattern of five different perovskite materials.

FIG. 11 shows the XRD patterns of five different perovskite materials of composition $FA_{1-x}Cs_xPbI_3$ (0.05×0.25). In the XRD diffraction patterns of FIG. 11(A), all of the maxima correspond to the trigonal symmetry (space group: P3̂m1) of the FAPbI3. Traces of $PbI_2$ and FTO are observed too, however there is no signal corresponding to the yellow polymorph. FIG. 11(B) then shows the displacement on the first peak of the perovskite, from which it can seen that the maxima are shifted to bigger 2θ values indicating a decrease in the cell parameters which fits with the partial substitution of FA with a smaller cation as Cs. Therefore, a solid solution is formed in the range of 0.05≤x≤0.25.

Figure 12:
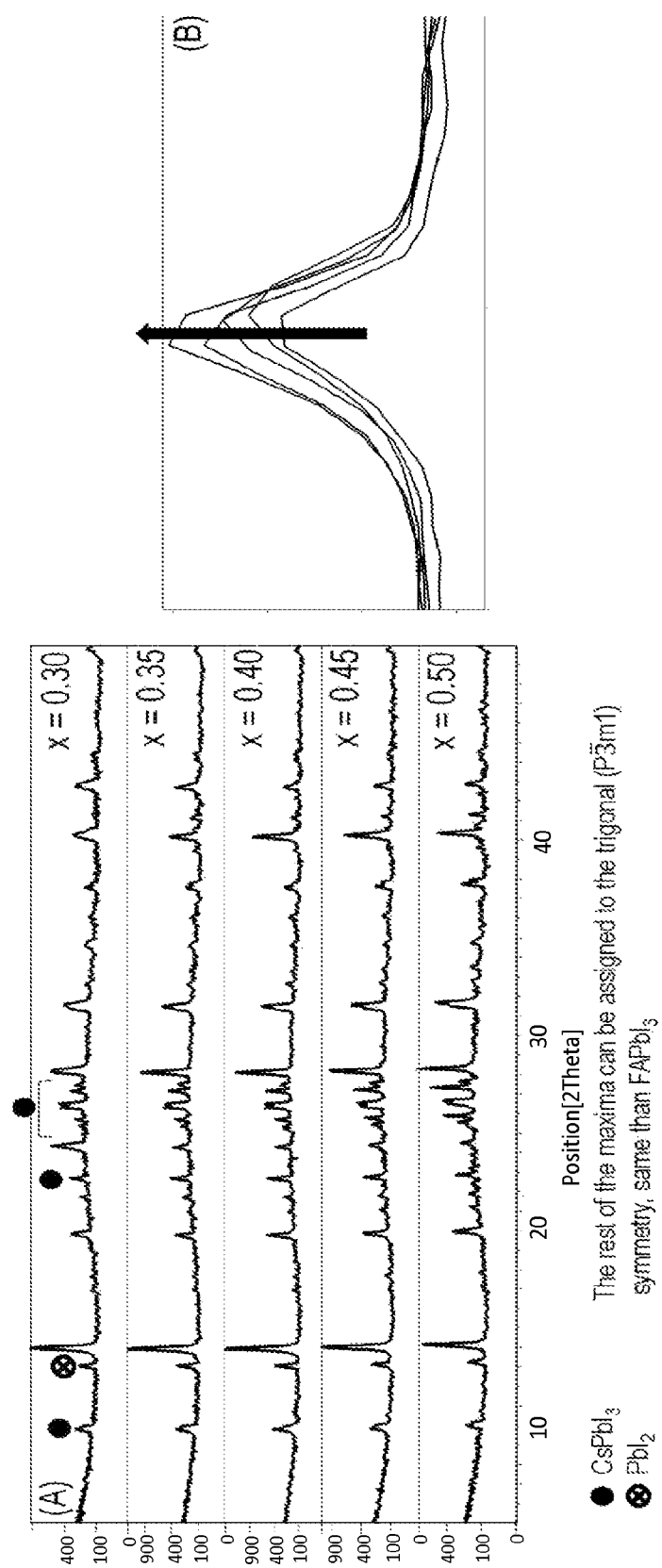
FIG. 12 shows the XRD pattern of a further five different perovskite materials.

FIG. 12 shows the XRD patterns of five different perovskite materials of composition $FA_{1-x}Cs_xPbI_3$ (0.30≤x≤0.50). In the XRD diffraction patterns of FIG. 12(A), the additional maxima (marked with a filled circle) correspond to the $CsPbI_3$ phase, and these peaks are more defined as the value of x increases (i.e. as the amount of Cs increases). FIG. 8(B) then shows the displacement on the first peak of the perovskite; however, there is no obvious shift in the peak, indicating that no more Cs can be introduced in the $FAPbI_3$ perovskite This experiment establishes the range in which Cs can partially substitute FA in the $FAPbI_3$ perovskite to form the black polymorph avoiding the yellow phase and leading to more thermostable phases.

Figure 13:
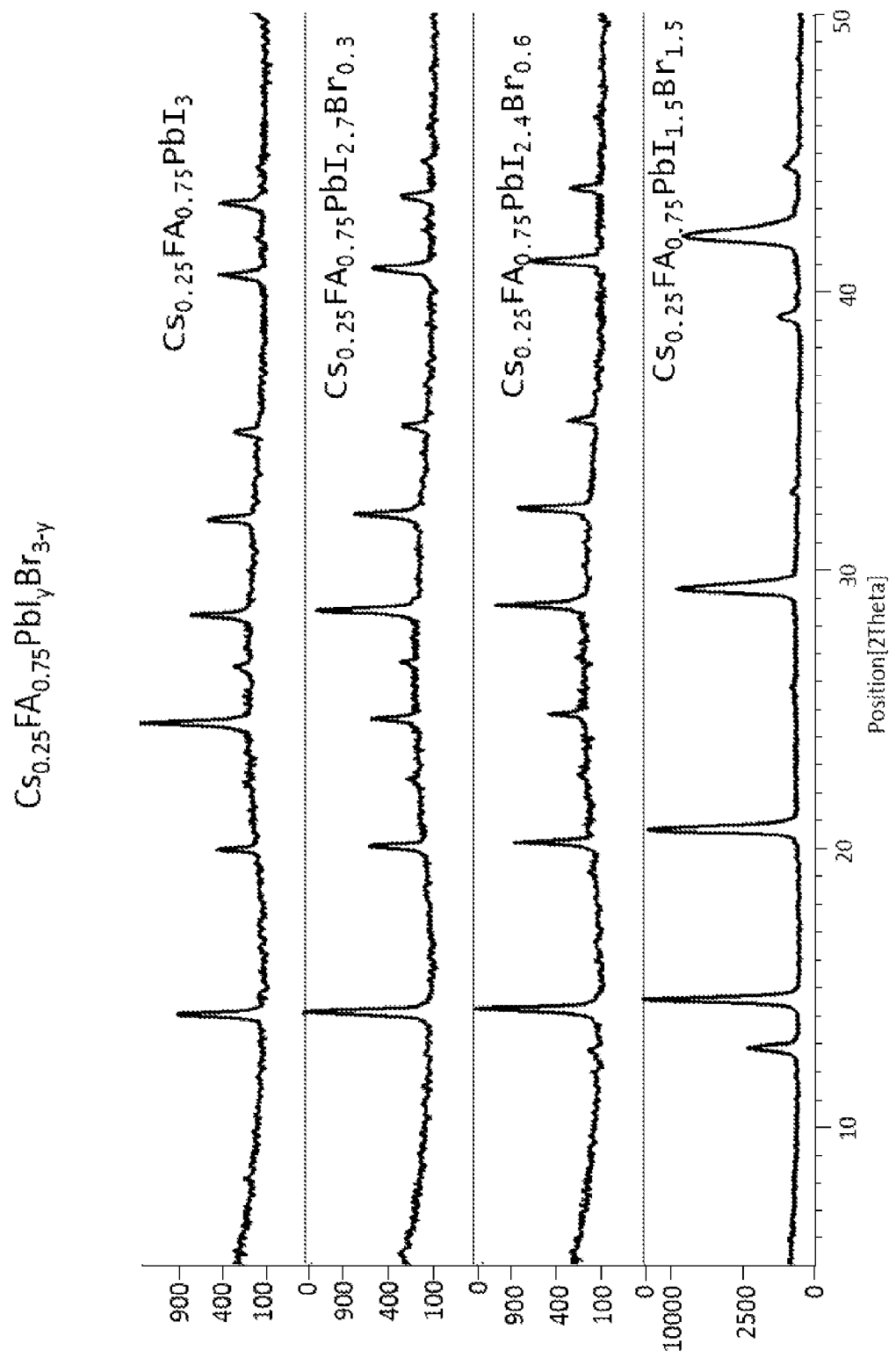
FIG. 13 shows the XRD pattern of a further four different perovskite materials.

FIG. 13 shows the XRD patterns of four different perovskite materials of composition $FA_{1-x}Cs_xPbI_3$ with x=0.25, and 1.5≤y≤3.

It will be appreciated that individual items described above may be used on their own or in combination with other items shown in the drawings or described in the description and that items mentioned in the same passage as each other or the same drawing as each other need not be used in combination with each other.

Furthermore, although the invention has been described in terms of preferred embodiments as set forth above, it should be understood that these embodiments are illustrative only. Those skilled in the art will be able to make modifications and alternatives in view of the disclosure which are contemplated as falling within the scope of the appended claims. For example, those skilled in the art will appreciate that whilst the above-described embodiments of the invention all relate to photovoltaic devices, aspects of the invention may be equally applicable to other optoelectronic devices. In this regard, the term "optoelectronic devices" includes photovoltaic devices, photodiodes (including solar cells), phototransistors, photomultipliers, photoresistors, and light emitting diodes etc. In particular, whilst in the above-described embodiments the photoactive perovskite material is used as a light absorber/photosensitizer, it may also function as light emitting material by accepting charge, both electrons and holes, which subsequently recombine and emit light.

The invention claimed is:

1. A perovskite material of general formula (I):

$$A_{1-x}A'_xBX_{3-y}X'_y \quad (I)$$

wherein A is a formamidinium cation $((HC(NH_2)_2)^+)$, A' is a caesium cation $(Cs^+)$, B is at least one divalent inorganic cation, X is iodide and X' is bromide; and wherein $0 < x \leq 0.4$ and $0 < y \leq 3$.

2. A perovskite material according to claim 1, which has a bandgap of from 1.60 eV to 2.30 Ev.

3. A perovskite material according to claim 1, wherein B is at least one inorganic cation selected from $Pb^{2+}$ and $Sn^{2+}$.

4. A perovskite material according to claim 1, which has the formula:

$$FA_{1-x}Cs_xPbI_{3-y}Br_y \quad (II)$$

wherein FA is a formamidinium cation $((HC(NH_2)_2)^+)$, Cs is a caesium cation $(Cs^+)$, Pb is a lead (II) cation $(Pb^{2+})$, I is iodide (I−), and Br is bromide (Br−).

5. A perovskite material according to claim 4, wherein $0.05 \leq x \leq 0.25$.

6. A perovskite material according to claim 4, wherein $0 < y < 1.5$.

7. An optoelectronic device comprising the perovskite material according to claim 1.

8. An optoelectronic device according to claim 7, wherein the device is a light-emitting diode.

9. A method for producing a perovskite material according to claim 1, wherein the perovskite material is in the form of a solid layer; wherein the method comprises chemical solution deposition and comprises:
    (i) forming a precursor solution comprising precursors of the perovskite material dissolved in a solvent system;
    (ii) disposing/depositing a layer of the precursor solution; and
    (ii) removing the solvent system to produce a solid layer of the perovskite material.

10. A method according to claim 9, wherein the precursors of the perovskite material comprise:
    a first precursor compound comprising the formamidinium cation $((HC(NH_2)_2)^+)$ (A) and a first halide anion;
    a second precursor compound comprising the caesium cation $(Cs^+)$ (A') and either the first halide anion or a second halide anion; and
    a third precursor compound comprising the divalent inorganic cation (B) and the second halide anion;
    wherein the first halide anion is one of iodide (X) and bromide (X'), and the second halide is the other of iodide (X) and bromide (X').

11. A method according to claim 10, wherein the precursors of the perovskite material further comprise a fourth precursor compound comprising the divalent inorganic cation (B) and the first halide anion.

12. A method according to claim 9, wherein the precursors of the perovskite material comprise:
    a first precursor compound comprising the formamidinium cation $((HC(NH_2)_2)^+)$ (A) and a first halide anion;
    a second precursor compound comprising the formamidinium cation $((HC(NH_2)_2)^+)$ (A) and a sacrificial organic anion (Y);
    a third precursor compound comprising the caesium cation $(Cs^+)$ (A') and either the first halide anion or a second halide anion; and
    a fourth precursor compound comprising the divalent inorganic cation (B) and a second halide anion;
    wherein the first halide anion is one of iodide (X) and bromide (X'), and the second halide is the other of iodide (X) and bromide (X')).

13. A method according to claim 12, wherein the sacrificial organic anion (Y) is an organic anion of formula $RCOO^-$, $ROCOO^-$, $RSO_3^-$, $ROP(O)(OH)O^-$ or $RO^-$, wherein R is H, substituted or unsubstituted $C_{1-10}$ alkyl, substituted or unsubstituted $C_{2-10}$ alkenyl, substituted or unsubstituted $C_{2-10}$ alkynyl, substituted or unsubstituted $C_{3-10}$ cycloalkyl, substituted or unsubstituted $C_{3-10}$ heterocyclyl or substituted or unsubstituted aryl.

14. A method according to claim 9, wherein the step of producing a solid layer of the perovskite material by chemical solution deposition comprises:
    (i) forming a first precursor solution comprising one or more precursors of the perovskite material dissolved in a first solvent system;
    (ii) disposing/depositing a layer of the first precursor solution;
    (iii) removing the first solvent system to form a solid layer of the one or more precursors;
    (iii) forming a second precursor solution comprising one or more further precursors of the perovskite material dissolved in a second solvent system; and
    (iv) treating the solid layer of the one or more precursors with the second precursor solution and thereby reacting the one or more precursors and the one or more further precursors to produce a solid layer of the perovskite material.

15. A method according to claim 14, wherein:
    the one or more precursors of the perovskite material comprise:
        a first precursor compound comprising the divalent inorganic cation (B) and a first halide anion, and
    the one or more further precursors of the perovskite material comprise:
        a second precursor compound comprising the formamidinium cation $((HC(NH_2)_2)^+)$ (A) and either the first halide anion or a second halide anion, and a third precursor compound comprising the caesium cation $(Cs^+)$ (A') and the second halide anion;
    wherein the first halide anion is one of iodide (X) and bromide (X'), and the second halide is the other of iodide (X) and bromide (X').

* * * * *